(12) United States Patent
Haratani et al.

(10) Patent No.: US 7,692,229 B2
(45) Date of Patent: Apr. 6, 2010

(54) MAGNETIC MEMORY INCLUDING FERROMAGNETIC YOKE AND ANTIFERROMAGNETIC LAYER

(75) Inventors: Susumu Haratani, Tokyo (JP); Takashi Asatani, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/430,630

(22) Filed: May 4, 2006

(65) Prior Publication Data

US 2007/0023807 A1    Feb. 1, 2007

(30) Foreign Application Priority Data

Jul. 27, 2005  (JP) .............................. 2005-217141
Mar. 17, 2006  (JP) .............................. 2006-073982

(51) Int. Cl.
*H01L 29/94* (2006.01)
(52) U.S. Cl. ...................................... 257/295; 365/158
(58) Field of Classification Search ................ 257/421, 257/295, E21.108, E21.663, E27.104, E29.164; 365/55, 63, 129, 158, 171–173, 232, 145; 438/3

See application file for complete search history.

(56) References Cited

U.S. PATENT DOCUMENTS

| | | | | | |
|---|---|---|---|---|---|
| 4,455,626 | A | * | 6/1984 | Lutes | 365/158 |
| 5,477,482 | A | * | 12/1995 | Prinz | 365/129 |
| 5,587,943 | A | | 12/1996 | Torok et al. | 365/158 |
| 6,430,084 | B1 | * | 8/2002 | Rizzo et al. | 365/173 |
| 6,466,471 | B1 | * | 10/2002 | Bhattacharyya | 365/55 |
| 6,510,078 | B2 | * | 1/2003 | Schwarzl | 365/158 |
| 6,519,179 | B2 | * | 2/2003 | Minakata et al. | 365/171 |
| 6,661,688 | B2 | * | 12/2003 | Bloomquist et al. | 365/63 |
| 6,724,652 | B2 | * | 4/2004 | Deak | 365/158 |
| 6,740,947 | B1 | * | 5/2004 | Bhattacharyya et al. | 257/421 |
| 2003/0186552 | A1 | * | 10/2003 | Amano et al. | 438/694 |
| 2003/0207486 | A1 | | 11/2003 | Deak | |
| 2005/0207263 | A1 | * | 9/2005 | Okayama et al. | 365/232 |
| 2006/0067007 | A1 | * | 3/2006 | Haratani | 360/321 |

FOREIGN PATENT DOCUMENTS

| | | |
|---|---|---|
| JP | 2004-47656 | 2/2004 |
| JP | 2004-087870 | 3/2004 |
| WO | WO 03/043020 A1 | 5/2003 |

OTHER PUBLICATIONS

Tehrani et al., Nikkei Electronics, Nov. 18, 2002, pp. 127-138 (partial English translation thereof).

\* cited by examiner

*Primary Examiner*—David Vu
*Assistant Examiner*—Suberr Chi
(74) *Attorney, Agent, or Firm*—Porzio, Bromberg & Newman, P.C.

(57) ABSTRACT

In a magnetic memory 1, a magneto-resistivity effect element 4 is disposed adjacently to a wire 5 for producing a writing magnetic field and further a ferromagnetic body 20 is disposed so as to cover at least part of the wire 5 and consequently orient the state X of magnetization of this ferromagnetic body 20 in one direction. According to this invention, it is made possible to homogenize the magnetic property during the course of writing and implement the writing work efficiently.

3 Claims, 16 Drawing Sheets (A)

(B)

(A)

(B)

MAGNETIC MEMORY INCLUDING FERROMAGNETIC YOKE AND ANTIFERROMAGNETIC LAYER

BACKGROUND OF THE INVENTION

1. Field of the Invention

This invention relates to a magnetic memory for storing information in a magneto-resistivity effect element.

2. Description of the Related Art

In recent years, the MRAM (Magnetic Random Access Memory) has been attracting attention as a memory cell for use in such information processing devices as computers and communication facilities. Since the MRAM is capable of memorizing data magnetically and therefore maintaining directions of magnetization without having to use any electric means, it is safe from incurring the disadvantage of losing information due to power failure as experienced by the DRAM (Dynamic Random Access Memory) and SRAM (Static RAM) which are volatile memories. The MRAM also excels such conventional nonvolatile memories as the flash EEPROM and the hard disk device in terms of access speed, reliability, and power consumption. The MRAM, therefore, is reputed to be capable of alternating all the functions of such volatile memories as DRAM and SRAM and the functions of such nonvolatile memories as the flash EEPROM and the hard disc devices.

In the development of an information device directed toward the so-called ubiquitous computing which enables information to be processed everywhere at the same time, the desirability of such a memory which fulfills high-speed processing and decreases power consumption as well and permits avoidance of loss of information even in the case of power failure finds general recognition. The MRAM promises to satisfy all these requirements and is expected to find adoption in numerous information devices in the future.

Particularly, cards and portable information terminals which are carried daily by users on their persons often fail to secure sufficient power supply. When a large volume of information is processed under a harsh environment of utility, therefore, even the MRAM which boasts of low power consumption is required to allow further decrease of power consumption during the course of processing information.

As one example of the technique which is capable of further decreasing power consumption in the MRAM, the magnetic memory which is published on page 133 of the Nov. 18, 2002 issue of the "Nikkei Electronics" is now available. This magnetic memory 500, as illustrated in FIG. 19, is provided in each of the individual memory regions (memory cells) thereof with a bit line 502, a word line 504 disposed perpendicularly to the bit line 502, a tunneling magneto-resistive element (TMR) 506 disposed between the bit line 502 and the word line at the position of intersection thereof, and a transistor 508 connected to the TMR element. The bit line 502 and the word line 506 are each adapted to generate nearly half of the magnetic field necessary for reversing the bit state (magnetized state) of the TMR element 506. When an electric current is advanced through the bit line 502 and word line 504 which have been selected, the magnetized state of the TMR element 506 is suitably inverted at the point of intersection of these lines.

This magnetic memory 500 is so configured that both the bit lines 502 and the word lines 504 are furnished with a structure clad with a ferromagnetic thin film 510 of high permeability. Thus, the leaks of magnetic flux from the bit line 502 and the word line 504 can be reduced. During the passage of electric current through the bit lines 502 and the word lines 504, since the ferromagnetic thin film 510 is made to generate a static magnetic field in consequence of the magnetization of the ferromagnetic thin film 510, the sum of this static magnetic field of the ferromagnetic thin film 510 and the induction magnetic fields of the bit lines 502 and the word lines 504 is applied to the TMR element 500. As a result, the magnetic field necessary for the inversion of the magnetized state of the TMR element 506 can be obtained even when the state of power consumption is low.

Since this magnetic memory is enabled to concentrate the magnetic flux in the TMR element 506 by keeping the bit lines and the word lines covered each on three surfaces with the ferromagnetic thin film 510 and leaving their surfaces on the TMR element 506 side open, it enjoys an advantage of reducing the writing time.

Incidentally, the TMR element is furnished with a first magnetizing layer (magnetic susceptibility layer) enabled to change the direction of magnetization by an external magnetic field, a second magnetic layer having a fixed direction of magnetization, and a non-magnetic insulating layer interposed between the first magnetic layer and the second magnetic layer and is adapted to memorizes binary data by controlling the direction of magnetization of the first magnetic layer parallel or not parallel to the direction of magnetization of the second magnetic layer.

A further study made by the present inventor, however, has ascertained that the coating of the bit lines 501 and the word lines 504 with the ferromagnetic thin film 510 is liable to induce dispersion in the produced magnetic field while it is indeed capable of reducing the magnitude of the electric current during the course of writing. Specifically, the ferromagnetic thin film 510 incurs difficulty in uniformly coating the bit lines 502 and the word lines along the directions of length thereof, eventually acquires in the interior thereof various directions of magnetization owing to the spontaneous formation of a plurality of magnetic domains. Because of these factors, the ferromagnetic thin film 510 entails the possibility of dispersing the magnetizing property to be imparted to the individual TMR elements 506 during the course of writing.

When the magnetic field is inverted by switching the directions of passage of electricity to the bit lines 502 and the word lines 504, the presence of the ferromagnetic thin film 510 results in posing the problem of rendering ununiform the speed of change and the intensity of the magnetic field between the electric current in the forward direction and the electric current in the reverse direction. As a result, the individual TMR elements 506 incur dispersion in the writing speed in one direction and the writing speed in the other direction and consequently cause an anxiety about complicating the control of electric current and the control of timing in the course of writing.

When the ferromagnetic thin film 501 happens to form numerous magnetic domains, it suffers emission of a Barkhausen noise during the change of the state of magnetization of the bit lines 502 and the word lines 504. This noise is considered to constitute a factor for deteriorating the writing property.

This invention, originated in the light of the problems enumerated above, is directed toward abating the dispersion of the magnetic field for writing in the magnetic memory and enhancing the writing property.

SUMMARY OF THE INVENTION

The magnetic memory according to this invention is characterized by being provided with an electric wire for producing a magnetic field for writing information, a magneto-resistivity effect element disposed adjacently to the electric wire, and a ferromagnetic body disposed so as to cover at least part of the electric wire and having a state of magnetization oriented in a prescribed direction. By so doing, the magnetic memory is enabled to have the writing efficiency and accuracy of information enhanced because the magnetizing property of the ferromagnetic body is uniformized even when the electric wire is coated with the ferromagnetic body or the electric wire is encircled with yokes of ferromagnetic body for the purpose of exalting the magnetic efficiency. It is enabled as well to smooth the changes of magnetization of the ferromagnetic body.

Further, the orientation of the magnetizing state thus effected is preferred to result in having the ferromagnetic body magnetized in the form of a single magnetic domain. Thus, it is made possible to prevent the shift of a magnetic wall from imparting discontinuous changes to the magnetizing property.

The magnetic memory of this invention is further characterized by having the state of magnetization of the ferromagnetic body pinned down in substantially the same direction as the direction of extension of the electric wire. As a result, the changes of the induced magnetic field of the ferromagnetic body are homogenized relative to both the directions of passage of electricity in the electric wire because the state of magnetization is constantly pinned in the neutral direction relative to the magnetic fields of the two directions which occur in the periphery of the electric wire.

The magnetic memory according to this invention is characterized by being provided with an electric wire for producing a magnetic field for writing information, a magneto-resistivity effect element disposed adjacently to the electric wire, a ferromagnetic body so disposed as to cover at least part of the electric wire, and a means for fixing the direction of magnetization of the ferromagnetic body by pinning down the state of the magnetization in substantially the same direction as the direction of extension of the electric wire. Thus, the state of magnetization can be further stabilized because the means for fixing the direction of magnetization is capable of fastening the ferromagnetic body relative to the directions of distribution of the electric wire.

As the means for fixing the direction of magnetization, the ferromagnetic body is preferred to have an antiferromagnetic layer added thereto. This addition of the antiferromagnetic layer results in establishing a exchange coupling between the antiferromagnetic layer and the ferromagnetic body.

When a plurality of magneto-resistivity effect elements are disposed along the directions of distribution of the electric wire mentioned above and a plurality of ferromagnetic bodies are disposed each astride the plurality of adjacent points with the magneto-resistivity effect element in the electric wire, it is made possible to abate the dispersion of the state of magnetization on the electric wire even when the electric wire is resorted to in operating the plurality of magneto-resistivity effect element for a writing work.

It is likewise preferable to have the ferromagnetic body so disposed as to coat the counterelement surface destined to fall on the opposite side of the magneto-resistivity effect element in the electric wire and the opposite lateral surfaces continuing into the counterelement surface in the electric wire and the antiferromagnetic layer added to the outside of the ferromagnetic body. As a result, the magnetic field produced from the electric wire is enabled to be concentrated further in the magneto-resistivity effect element. Even in this case, the changes of the magnetic field can be smoothed.

Further, these aspects of this invention are enabled, by being furnished each with a plurality of magneto-resistivity effect element, to form a plurality of memory cells capable of retaining information in the magneto-resistivity effect element. By having the ferromagnetic bodies and the means for fixing the directions of magnetization so disposed as to exist in an independent state in each of the individual memory cells, it is made possible to concentrate the magnetic field produced from the electric wire in the magneto-resistivity effect element by means of the ferromagnetic body, pinned down the direction of magnetization in each of the ferromagnetic bodies, and stabilize the state of magnetization.

The magnetic memory of this invention is characterized by being provided with an electric wire for producing a magnetic field for writing information, a magneto-resistivity effect element disposed adjacently to the electric wire, a ferromagnetic yoke so disposed as to cover the adjacent regions of the electric wire to the magneto-resistivity effect element, and an antiferromagnetic layer added to the ferromagnetic yoke and adapted to establish approximate coincidence between the direction of pinning the state of magnetization of the ferromagnetic yoke and the direction of extension of the electric wire.

When the magnetic field of the electric wire is positively concentrated in the magneto-resistivity effect element by adopting the ferromagnetic yoke in the manner described above, the magnetic field is liable to incur dispersion in the intensity and the varying property of the magnetic field. By the addition of the antiferromagnetic layer, however, the varying property of the magnetic field can be stabilized. When the forward and the reverse direction of the magnetic field for writing information are switched, the two states of magnetization can be homogenized.

In this case, it is preferable to have the aforementioned ferromagnetic yoke composed of an element side yoke disposed on the aforementioned magneto-resistivity effect element side in the electric wire as separated from the electric wire, a counterelement side yoke disposed on the side opposite the magneto-resistivity effect element in the electric wire as separated from the electric wire, and a pair of lateral part yokes looping the ferromagnetic yoke by connection to the opposite terminals of the element side yoke and the opposite terminals of the counterelement side yoke and separated from the electric wire, have the looped ferromagnetic yoke passing the electric wire on the inner peripheral side thereof, and have the ferromagnetic yoke adding the antiferromagnetic layer to at least part of the outer peripheral side thereof.

Further, in this case, it is preferable to have the looped states of the ferromagnetic yoke kept unconnected by having the element side yoke divided in the direction of looping and have the magneto-resistivity effect element so disposed as to be intercalated in the divided region of the element side yoke. As a result, it is made possible to enable the magnetic field emitted from the divided surface of the element side yoke to be applied to the end face of the magneto-resistivity effect element and consequently enable the writing speed to be increased.

This invention is capable of stabilizing the magnetic field produced from the electric wire, smoothing the change of this magnetic field, and manifesting the effect of enhancing the writing property.

BRIEF DESCRIPTION OF THE DRAWINGS

The above and other objects, features, and advantages of the present invention will become apparent from the follow

DETAILED DESCRIPTION OF THE PREFERRED EMBODIMENTS

Now, the mode of embodiment of the magnetic memory according to this invention will be described in detail below with reference to the accompanying drawings. In the description of the drawings, like components will be denoted by like symbols and repeated explanations will be omitted.

Figure 1:
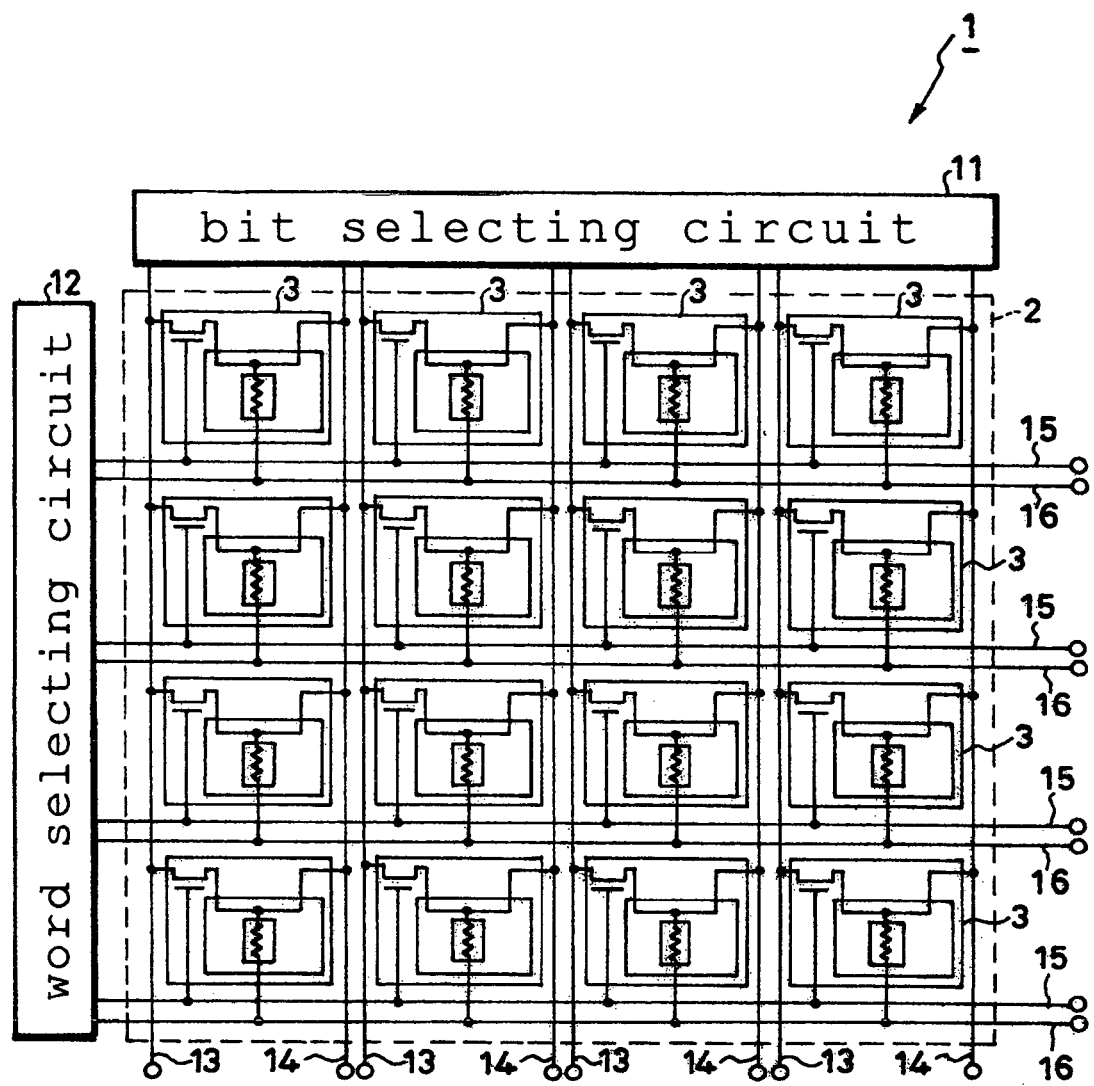
- FIG. 1 is a conceptual diagram illustrating the whole structure of a magnetic memory according to the first embodiment of this invention.
Figure 2:
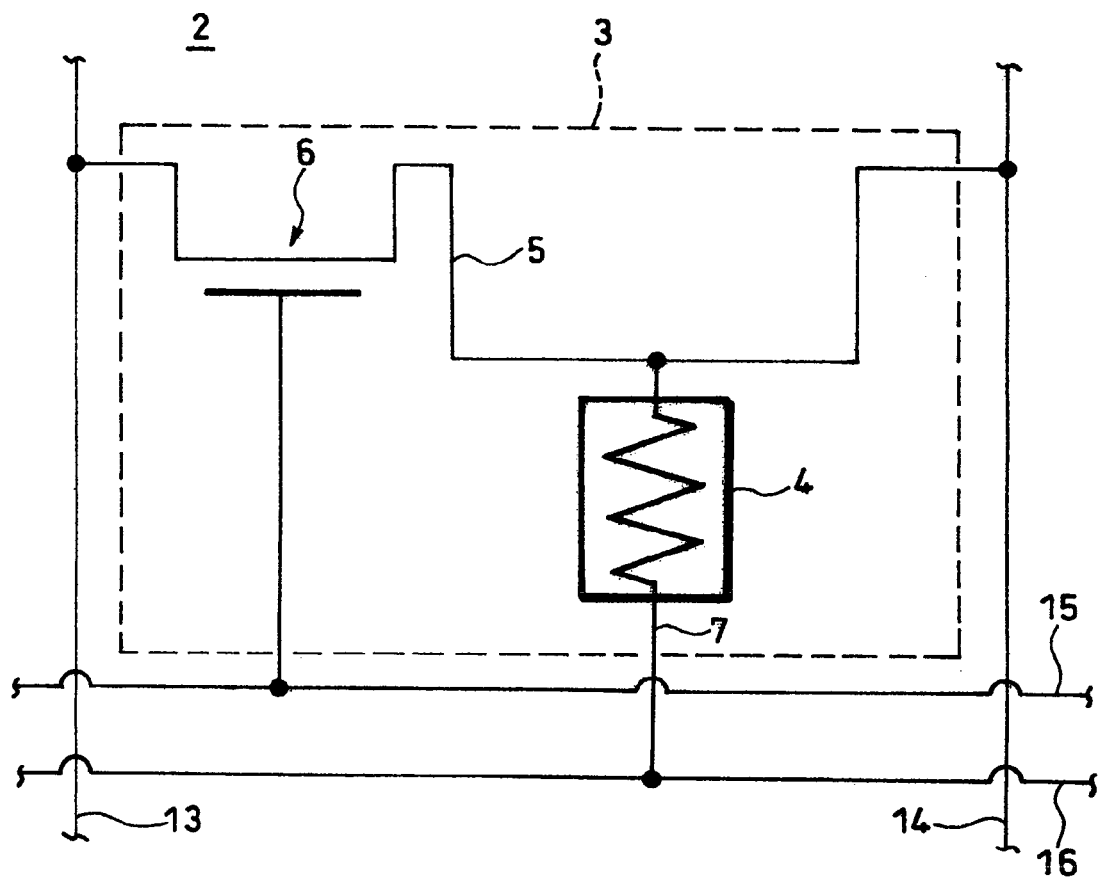
FIG. 2 is a conceptual diagram illustrating the memory cell of the magnetic memory in an enlarged scale.

FIG. 1 is a conceptual diagram illustrating the whole structure of a magnetic memory 1 according to the first embodiment. A magnetic memory 1 is provided with a memory part 2, a bit selecting circuit 11, a word selecting circuit 12, bit lines 13 and 14, and word lines 15, 16. In the memory part 2, a plurality of memory cells 3 are two-dimensionally arrayed in m lines and n rows (m and n each denoting an integer of not less than 2). As illustrated in an enlarged scale in FIG. 2, the memory regions 3 are individually furnished with a TMR element 4, a combination reading-writing wire 5, a combination reading-writing transistor 6, a reading wire 7, a ferromagnetic yoke 20, etc. Incidentally, the combination reading-writing wire 5 is laid so as to be led in from the bit line 13. Incidentally, since the combination reading-writing wire 5 is so laid as to be led in from the bit line 13, the memory cells 3 individually have the combination reading-writing wire 5, the ferromagnetic yoke 20, and a means for pinning down the ferromagnetic yoke 20 (as specifically described herein below).

The TMR (tunneling magneto-resistivity effect) element 4 possesses the function of varying the magnitude of resistance of itself on the basis of a change in the direction of magnetization. The state of change in this magnitude of resistance causes the TMR element 4 to have a binary data written therein. An external magnetic field which changes the direction of magnetization of the TMR element 4 is generated by the combination reading-writing wire 5.

One terminal of the combination reading-writing wire 5 is electrically connected to the bit line 13 via the combination reading-writing transistor 5. The other terminal of the combination reading-writing wire 5 is electrically connected to the bit line 14. The combination reading-writing transistor 6 is a switching means for controlling the passage of a writing current and a reading current in the combined reading-writing wire 5, with the combination reading-writing wire 5 connected to either of the drain and the source thereof and the bit line 13 connected to the remainder thereof. Further, the word line 15 is connected to the gate thereof. As a result, the combination reading-writing wire 5 acquires supply of electric current by means of the combination reading-writing transistor 6 and generates a magnetic field in the periphery thereof by virtue of this electric current.

The reading wire 7 has one terminal thereof connected to the TMR element 4 and the other terminal thereof to the word line 16. In the TMR element 4, the supply of the reading current thereto is accomplished by connecting the combination reading-writing wire 5 to the surface opposite the side on which the word line 16 is connected.

The bit lines 13 and 14 are disposed for each of the plurality of rows of memory cells 3 which are disposed in an arrayed pattern. The bit lines 13 are connected to the combination reading-writing transistors 6 in all the memory cells 3 belonging to the pertinent rows and connected to one-side terminals of the combination reading-writing wires 5 via the combination reading and writing transistors 6. Then, the bit lines 14 are connected to the other-side terminals of the combination reading-writing wires 5 in all the memory cells 3 belonging to the pertinent rows. The flow of electric current to the combination reading-writing wires 5 is started by permitting conduction of electricity by the combination reading-writing transistors 6 while imparting an electric potential difference between the bit line 13 and the bit line 14.

The word lines 15 and 16 are laid in the individual lines of the memory cell 3. The word lines 15 are connected to the gates of combination reading-writing transistors in all the memory cells 3 belonging to the pertinent lines. Then, the word lines 16 are connected to the TMR elements 4 via the combination reading-writing wires 7 in all the memory cells 3 belonging to the pertinent lines.

Referring back to FIG. 1, the bit selecting circuit 11 possesses the function of supplying a positive or negative writing current to the combination reading-writing wires 5 in the individual memory cells 3. Specifically, the bit selecting circuit 11 comprises an address decoder for selecting prescribed rows from the memory cells 3 disposed in an arrayed pattern in response to internally or externally designated addresses and a current drive circuit for imparting a positive or a negative electric potential difference between the bit lines 13 and 14 corresponding to the selected prescribed rows and supplying a writing current to the combination reading-writing wires 5 placed between the bit lines 13 and 14 of the prescribed rows.

The word selecting circuit 12 comprises an address decoder circuit for selecting prescribed lines from the memory cells 3 disposed in an arrayed pattern in response to internally or externally designated addresses and a current drive circuit for supplying a prescribed electric voltage to the word lines 15 and 16 corresponding to the prescribed lines. Thus, the combination reading-writing transistors 6 are enabled to acquire continuity by applying a controlling voltage to the word lines 15 corresponding to the prescribed lines by means of the word selecting circuit 12. By this continuity control, the choice between feeding and not feeding the writing current to the combination reading-writing wires 5 of the addresses selected by the bit selecting circuit 11 can be determined. The word selecting circuit 12 is further enabled to control the reading current by applying a prescribed electric voltage to the word lines 16. Specifically, in the bit selecting circuit 11, the rows corresponding to the internally or externally designated addresses are selected by the address decoder circuit and a prescribed electric voltage is applied to the relevant bit lines 13. At the same time in the word selecting circuit 12, the reading current is supplied between the bit lines 13 and the word lines 16 by selecting the lines corresponding to the address by the address decoder circuit and applying the prescribed voltage to the word lines 16 corresponding to the lines. On this occasion, the conduction of the reading current is controlled on the basis of the combination reading-writing transistor 6 by applying the electric voltage also to the word lines 15 in the selected lines.

Figure 3:
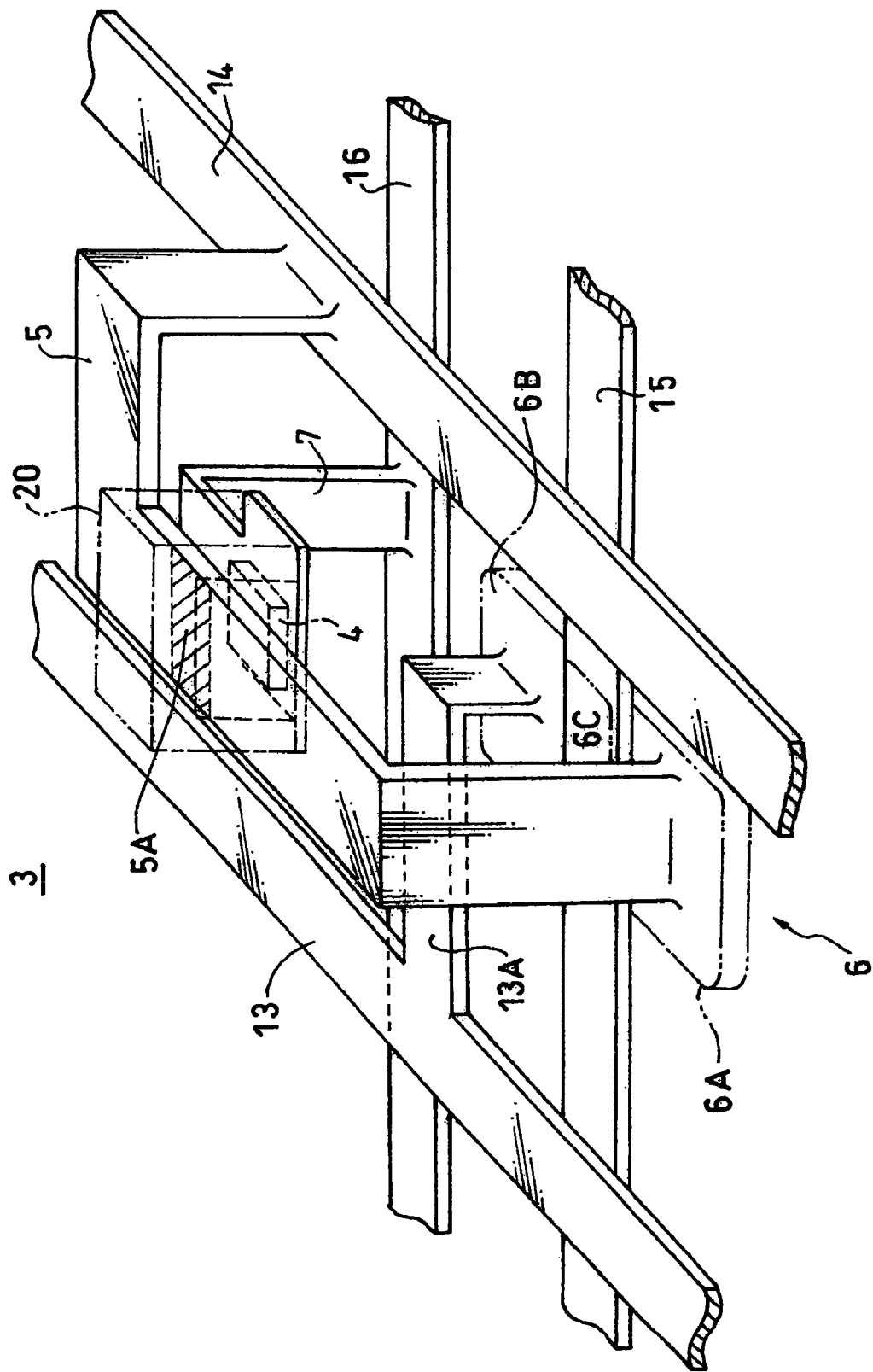
FIG. 3 is a enlarged perspective view illustrating the inner structure of the memory cell three-dimensionally.

Now, the concrete structure of the memory cell 3 in the magnetic memory 1 will be explained in detail below. FIG. 3 is a perspective view illustrating three-dimensionally the state of wire in the memory cell 3. The memory cell 3 is broadly furnished with a semiconductor layer, a wire layer, and a magnetic material layer as reckoned from the lower side. The semiconductor layer contains a semiconductor substrate which is not particularly illustrated, retains the mechanical strength of the whole memory cell 3, and forms such a semiconductor device as a combination reading-writing transistor 6. In the uppermost magnetic material layer, such structural articles of magnetic material as the TMR element 4 and the ferromagnetic yoke 20 adapted to impart a magnetic field efficiently to the TMR element 4 are formed. In the medially positioned wire layer, the bit lines 13 and 14, the word lines 15 and 16, part of the combination reading-writing wire 5, and the reading wire 7 are formed.

The combination reading-writing transistor 6 in the semiconductor layer is so formed as to be enclosed in an insulating region and is adapted to separate electrically the plurality of adjacent combination reading-writing transistors 6. The insulating region is formed of such an insulating material as, for example, $SiO_2$ and the semiconductor substrate is formed of an Si base, for example, and is destined to be doped with a p type or an n type impurity.

Figure 4:
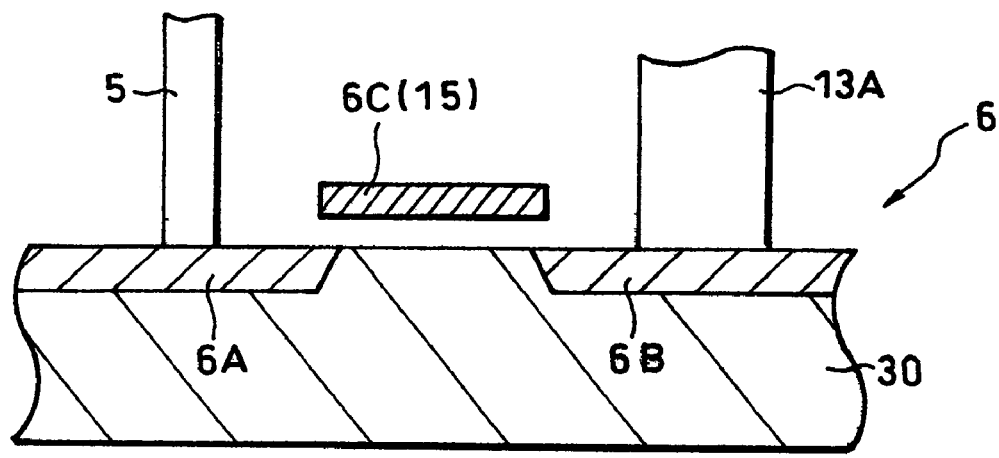
FIG. 4 is a cross section illustrating the structure of a transistor in the memory cell in an enlarged scale.

The combination reading-writing transistor 6, as illustrated in an enlarged scale in FIG. 4, is composed of a drain region 6A fated to constitute an inverse conduction type of a semiconductor substrate 30, a source region 6B, a gate electrode 6C, etc. As a result, the semiconductor substrate 30 intervenes between the drain region 6A and the source region 6B and the gate electrode 6C is disposed on the semiconductor substrate 30 across a prescribed gap. The gate electrode 6C is formed of the word line 15. owing to this construction, the application of an electric voltage to the word line 15 results in inducing mutual continuity of the drain region 6A and the source region 6C of the combination reading-writing transistor 6, with the result that the electric current supplied from the bit line 13 will flow to the combination reading-writing wire 5.

Referring back to FIG. 3, the region in the wire layer excluding the wires, i.e. the bit lines 13 and 14 and the word lines 15 and 16, is wholly occupied by the insulating region. As the material for the insulating region, such an insulating material as $SiO_2$ is used similarly to the insulating region of the semiconductor layer. Then, W or Al, for example, may be used as the material for the wires.

The combination reading-writing wire 5 which adjoins the TMR element 4 extends in the direction of the array surface (plane) of the memory cell 3 and assumes a shape bent on the letter L in the plane. Further, one terminal of the combination reading-writing wire 5 is bent in the direction perpendicular to the plane and enabled to form a perpendicular wire and is connected on the lower side thereof to the bit line 14. The other terminal of the combination reading-writing wire 5 is bent in the direction perpendicular similarly to the plane and made to form a perpendicular wire and is enabled at the lower terminal thereof to form an ohmic connection with the drain region 6A of the combination reading-writing transistor 6.

Then, the bit line 13 has a service wire 13A for each memory cell 3 formed as ramified in the direction of the plane and has the forward part bent in a perpendicular direction and enabled to form an ohmic connection with the source region 6B of the combination reading-writing transistor 6. The reading wire 7 is also extended in the direction of the plane, electrically connected at one terminal thereof to the TMR element 4, and bent at the other terminal in the perpendicular direction and connected on the lower side thereof to the word line 16.

The word line 15 which extends in the direction of line has part thereof concurrently serve as the gate electrode 6C. This fact is synonymous with the electric connection of the word line 15 to the gate electrode 6C of the combination reading-writing transistor 6.

Figure 5:
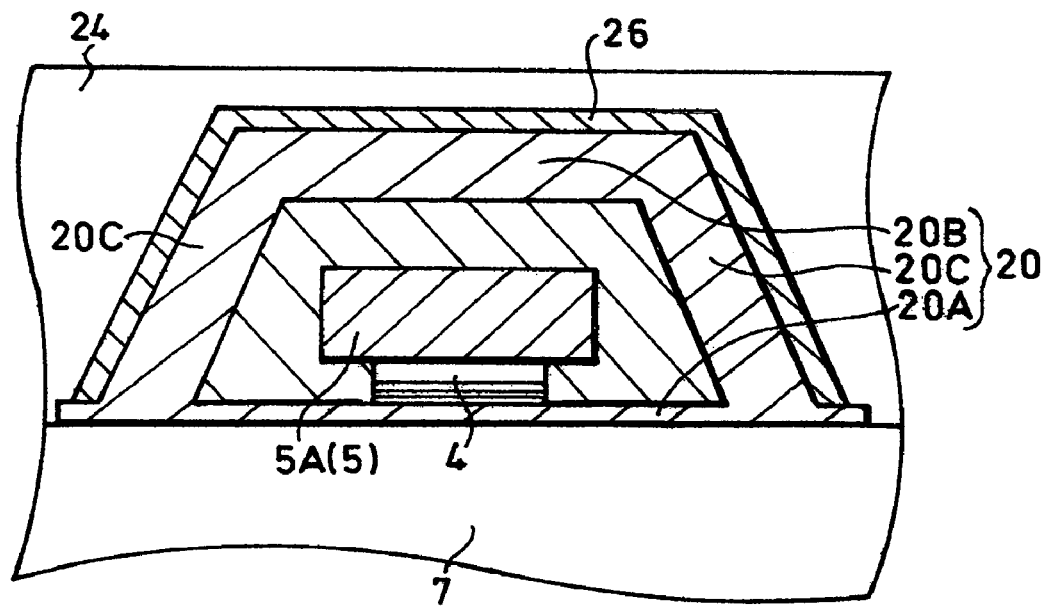
FIG. 5 is a cross section illustrating the structure of a magnetic layer in the memory cell in an enlarged scale.

The magnetic material layer will be explained next with reference to FIG. 5. The magnetic material layer is furnished with the TMR element 4, the ferromagnetic yoke 20, part of the combination reading-writing wire 5, part of the reading wire 7, etc. Incidentally, in the magnetic material layer, the construction to be explained below and the region excepting the other wires are occupied by an insulating region 24.

Figure 6:
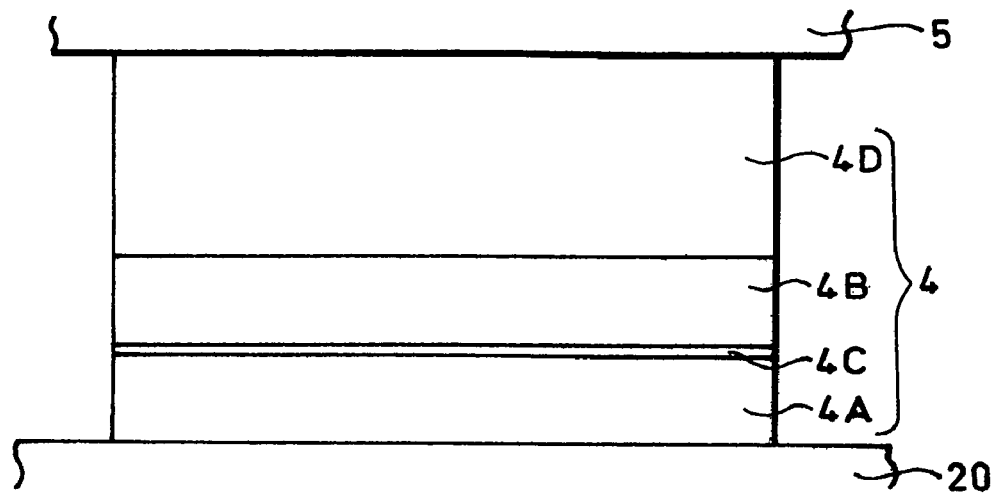
FIG. 6 is a side view illustrating the laminated structure of a magneto-resistivity effect element disposed in the magnetic layer in an enlarged scale.

The TMR element 4, as illustrated in an enlarged scale in FIG. 6, is furnished with a first magnetic layer (free layer/magnetosensitive layer) 4A having the direction of magnetization thereof varied by an external magnetic field, a second magnetic layer (pinned layer) 4B having the direction of magnetization fixed, a nonmagnetic insulating layer (insulator layer) 4C interposed between the first magnetic layer 4A and the second magnetic layer 4B, and an antiferromagnetic layer 4D adapted to fix (pin down) the direction of magnetization of the second magnetic layer. This TMR element 4 has a quality such that the magnitude of resistance between the first magnetic layer 4A and the second magnetic layer 4B varies when the direction of magnetization of the first magnetic layer 4A is varied in response to an external magnetic field. By this difference in the magnitude of resistance, the binary data can be recorded. Incidentally, as the material for the first magnetic layer 4A, such a ferromagnetic material as, for example, Co, CoFe, NiFe, NiFeCo, or CoPt may be used.

The second magnetic layer 4B has the direction of magnetization thereof fixed by the antiferromagnetic layer 4D. To be specific, the direction of magnetization of the second magnetic layer 4B is stabilized as oriented in one direction by the exchange coupling in the interface between the antiferromagnetic layer 4D and the second magnetic layer 4B. The direction of the easily magnetizing axis of the second magnetic layer 4B is set along the direction of the easily magnetizing axis of the first magnetic layer 4A. As the material for the second magnetic layer 4B, such a ferromagnetic material as, for example, Co, CoFe, NiFe, NiFeCo, or CoPt may be used. Then, as the material for the antiferromagnetic layer 4D, such a material as, for example, IrMn, PtMn, FeMn, PtPdMn, NiO, or an arbitrary combination thereof may be used.

The nonmagnetic insulating layer 4C is a layer formed of a nonmagnetic and insulative material and is interposed between the first magnetic layer 4A and the second magnetic layer 4B so as to give birth to a tunneling magneto-resistivity effect (TMR). More specifically, it has the characteristic property of varying the magnitude of electric resistance, depending on the relativity of the direction of magnetization (namely, parallel or not parallel) between the first magnetic layer 4A and the second magnetic layer 4B. As the material suitable for the nonmagnetic insulating layer 4C, the oxide or the nitride of such a metal as, for example, Al, Zn, and Mg may be used.

As a layer for stabilizing the direction of magnetization of the second magnetic layer 4B, a third magnetic layer may be provided through the medium of a nonmagnetic metal layer or a synthetic AF (antiferromagnetic) layer in the place of the antiferromagnetic layer 4D, though not specifically illustrated. This third magnetic layer is enabled, by forming an antiferromagnetic coupling with the second magnetic layer 4B, to effect further stabilization of the direction of magnetization of the second magnetic layer 4B. Though the material for the third magnetic layer does not need to be particularly restricted, such ferromagnetic materials as, for example, Co, CoF, NiFe, NiFeCo, and CoPt may be preferably used either singly or in combination. As a material suitable for the nonmagnetic metal layer to be interposed between the second magnetic layer 4B and the third magnetic layer, Ru, Rh, Ir, Cu, or Ag maybe used. The thickness of the nonmagnetic layer, for the sake of producing a strong antiferromagnetic coupling between the second magnetic layer 4B and the third magnetic layer, is preferred to be not more than 2 nm.

The antiferromagnetic layer 4D of the TMR element 4 is electrically connected to the combination reading-writing wire 5. The first magnetic layer 4A of the TMR element 4 is electrically connected to the reading wire 7 via the ferromagnetic yoke 20. Owing to this construction, it is made possible to advance the reading current from the combination reading-writing wire 5 to the reading wire 7 via the TMR element 4 and to detect the change in the magnitude of resistance of the TMR element 4. Incidentally, the ferromagnetic yoke 20 is so disposed as to cover a region 5A (refer to FIG. 3) of the combination reading-writing wire 5 adjoining the TMR element 4. Incidentally, the easily magnetizing axis of the first magnetic layer 4A of the TMR element 4 is so set as to lie along the direction intersecting the longer direction of the combination reading-writing wire 5 (namely, the direction intersecting the direction of the writing current).

Referring back to FIG. 5, the ferromagnetic yoke 20 is composed of an element side yoke 20A disposed on the TMR element side in the combination reading-writing wire 5, a counter element side yoke 20B disposed on the side opposite the TMR element 4 in the combination reading-writing wire 5, and a pair of lateral part yokes 20C and 20C looping the ferromagnetic yoke 20 by connection to the opposite terminals of the element side yoke 20A and the opposite terminals of the counterelement side yoke 20B in order for the combination reading-writing wire 5 to pass the interior thereof. The TMR element 4 is interposed between the element side yoke 20A and the combination reading-wiring wire 5. As a result, the first magnetic layer 4A of the TMR element 4 is connected to the reading wire 7 via the element side yoke 20A, while the antiferromagnetic layer 4D of the TMR element is made to contact the combination reading-writing wire 5. Between the ferromagnetic yoke 20 and the combination reading-writing wire 5 laid therein, an insulator 22 constitutes a gap so fast lest they should contact each other and give rise to an electric short.

The ferromagnetic yoke 20 is so set as to form approximately a trapezoidal shape as axially viewed from the direction of extension of the combination reading-writing wire 5. In the trapezoidal shape having the counterelement side yoke 20B as the upper bottom and the element side yoke 20A parallel thereto as the lower bottom, the lower bottom has a greater length than the upper bottom in the present embodiment. This dimensional difference allows the pair of lateral part yokes 20C and 20C each to assume a tilted state. As the ferromagnetic material for the ferromagnetic yoke 20, the metal containing at least one of the elements of Ni, Fe, and Co is used advantageously.

A yoke-grade antiferromagnetic layer 26 is formed on the outer peripheral sides of the counterelement side yoke 20B and the lateral part yoke 20C in the ferromagnetic yoke 20. The ferromagnetic yoke 20 has the direction of magnetization thereof stabilized by the exchange coupling in the interface thereof with the yoke-grade antiferromagnetic layer 26. The direction of pinning the state of magnetization in the ferromagnetic yoke 20 is so set as to coincide approximately with the direction of extension of the combination reading-writing wire 5, namely the direction perpendicular to the induction field produced by the combination reading-writing wire 5.

The operation of writing information in the TMR element in the magnetic memory 1 of the present embodiment will be explained next with reference to FIG. 7-FIG. 9.

Figure 7:
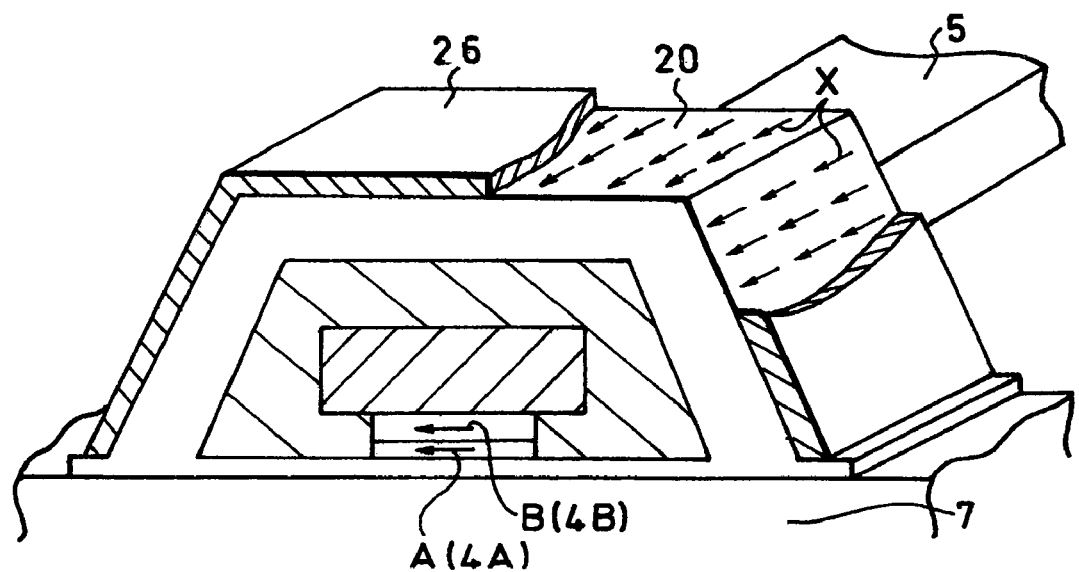
FIG. 7 is a partially cutaway perspective view illustrating as a type specimen the magnetized state of a ferromagnetic yoke in the magnetic layer.

Since the magnetic field produced by the combination reading-writing wire 5 fails to occur when the flow of electric current to the combination reading-writing wire 5 as illustrated in FIG. 7 is absent, the state X of magnetization of the ferromagnetic yoke 20 is affected by the pinning action of the yoke-grade antiferromagnetic layer 26 and is made to assume a state substantially coinciding with the direction of extension of the combination reading-writing wire 5. As a result, the ferromagnetic yoke 20 is in the state of a single magnetic domain having the whole magnetization uniformized in one direction. In the TMR element 4, the direction B of magnetization of the second magnetic layer 4B and the direction A of magnetization of the first magnetic layer 4A coincide with each other. Here, it is defined that the binary data 0 has been written in when the directions A and B of magnetization coincide with each other.

Figure 8:
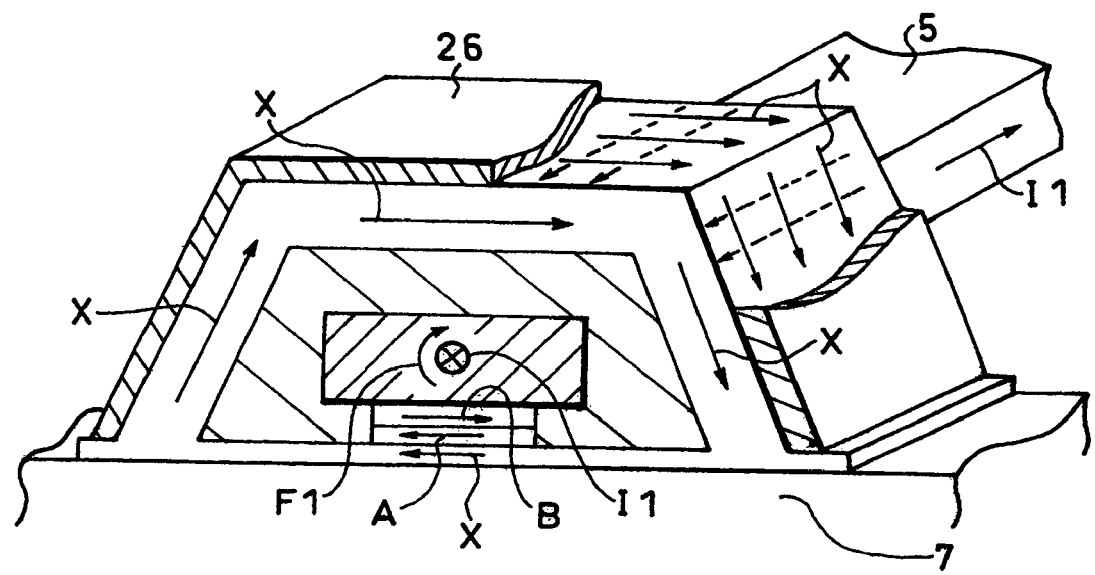
FIG. 8 is a partially cutaway perspective view illustrating as a type specimen the magnetized state of a ferromagnetic yoke in the magnetic layer.

When the writing current I1 flows to the combination reading-writing wire 5 as illustrated in FIG. 8, a peripherally directed magnetic field F1 is produced around the combination reading-writing wire 5. The magnetic field F1 turns round the interior of the ferromagnetic yoke 20 formed in the periphery thereof and consequently forms a closed route. The state X of magnetization of the ferromagnetic yoke 20, as guided by this magnetic field F1, causes the direction of magnetization to be smoothly rotated by 90 degrees till it coincides with the direction of the magnetic field F1 in spite of the influence of the pinning action of the yoke-grade antiferromagnetic layer 26.

As a result, a strong magnetic field resulting from the synthesis of the state F1 of magnetization produced from the combination reading-writing wire 5 and the state X of magnetization produced in the ferromagnetic yoke 20 acts on the first magnetic layer 4A in the TMR element 4 and induces reversion of the direction A of magnetization. When the flow of the electric current I1 of the combination reading-writing wire 5 is suspended in this state, the state X of magnetization of the ferromagnetic yoke 20 is smoothly returned to the state of FIG. 7 under the influence of the pinning action of the yoke-grade antiferromagnetic layer 26 while the direction A of magnetization of the TMR element is retained in the reversed state as illustrated in FIG. 8. Since the directions A and B of magnetization are retained in the opposed states, the binary data 1 is written in here.

Figure 9:
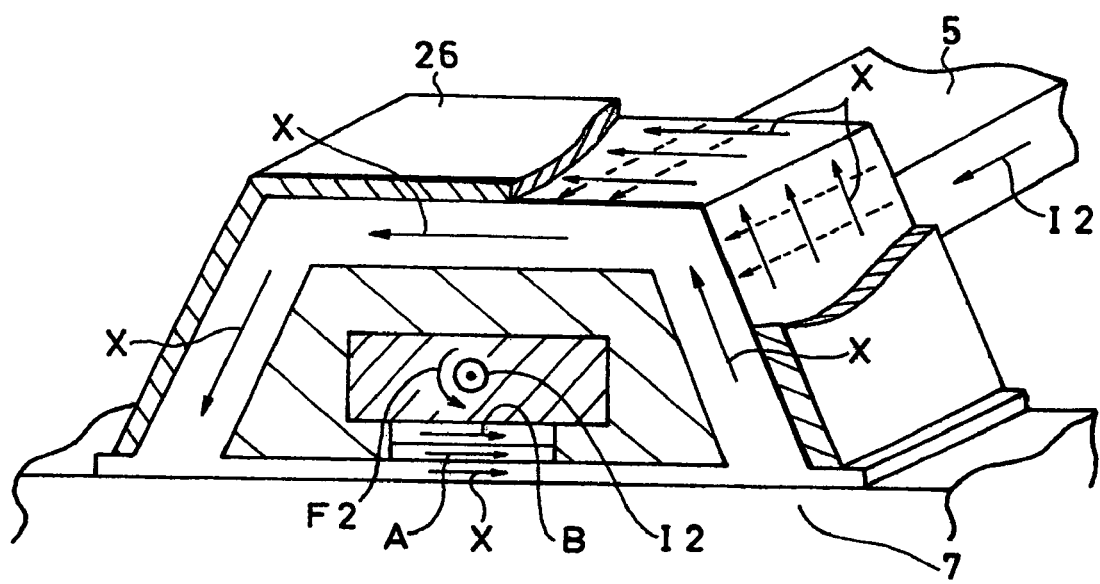
FIG. 9 is a partially cutaway perspective view illustrating as a type specimen the magnetized state of a ferromagnetic yoke in the magnetic layer.

When the writing current I2 flows next in the direction opposite the current I1 in the combination reading-writing wire 5 as illustrated in FIG. 9, a peripherally directed magnetic field F2 is generated around the combination reading-writing wire 5. The magnetic field F2 forms a closed route which turns round the interior of the ferromagnetic yoke 20 formed in the periphery thereof. The state X of magnetization of the ferromagnetic yoke 20, as guided by this magnetic field F2, causes the direction of magnetization to be smoothly rotated by 90 degrees till it coincides with the direction of the magnetic field F2 in spite of the influence of the pinning action of the yoke-grade antiferromagnetic layer 26.

As a result, the state F2 of magnetization produced from the combination reading-writing wire 5 and the state X of magnetization produced in the ferromagnetic yoke 20 are synthesized and the strong magnetic field consequently formed acts on the first magnetic layer 4A in the TMR element and reverses the direction A of magnetization till it coincides again with the direction B of magnetization of the second magnetic layer 4B. When the electric current I2 of the combination reading-writing wire 5 is suspended in this state, the state X of magnetization of the ferromagnetic yoke 20 is returned to the state of FIG. 7 under the influence of the pinning action of the yoke-grade antiferromagnetic layer 26. The TMR element 4, owing to the coincidence of the directions A and B of magnetization, results in writing the binary data 0 again here.

Incidentally, in the case of reading the binary data which has been written in the TMR element, the reading current is passed between the combination reading-writing wire 5 and the reading wire 7 and the change in the magnitude of the electric current or the change in the electric potential difference between the two wires is detected. This process reveals the magnitude of resistance of the TMR element 4 and determines whether or not either of the two binary data has been recorded (i.e. by discriminating as to whether the direction A of magnetization of the first magnetic layer 4A and the direction B of magnetization of the second magnetic layer 4B are parallel or not parallel with each other). When the direction A of magnetization of the first magnetic layer 4A coincides with the direction B of magnetization of the second magnetic layer 4B, for example, the magnitude of resistance between the first magnetic layer 4A and the second magnetic layer 4B becomes comparatively small owing to the tunneling magneto-resistivity effect (TMR) in the nonmagnetic insulating layer 4C. Conversely, when the direction A of magnetization and the direction B of magnetization fall in the reversed directions, the magnitude of resistance between the first magnetic layer 4A and the second magnetic layer 4B becomes comparatively large owing to the tunneling magneto-resistivity effect.

According to the magnetic memory 1 described above, since the state X of magnetization of the ferromagnetic yoke 20 constantly remains in the state of a single magnetic domain, it is made possible to smooth the change of magnetic field and abate the Barkhausen noise as compared with the case in which a plurality of magnetic domains are irregularly formed spontaneously. Further, when a plurality of memory cells 3 are disposed in an arrayed pattern as illustrated in FIG. 1, the magnetic field property obtained by the combination reading-writing wire 5 and the ferromagnetic yoke 20 can be homogenized among these memory cells and the control of writing can be facilitated.

Then, in the case of such an independent structure which has the combination reading-writing wire 5 led in from the bit line 13 for each of the memory cells 3 and the ferromagnetic yoke 20 formed in each of the combination reading-writing wires 5, the magnetizing properties of the individual memory cells tend to induce dispersion because the magnetizing properties generally differ among the plurality of ferromagnetic yokes 20. By having the ferromagnetic yokes 20 each form a single magnetic domain as in the present magnetic memory 1, however, it is made possible to abate the dispersion of the magnetizing properties and homogenize the writing speed, etc. among the plurality of memory cells 3.

When the combination reading-writing wire 5 is provided with the ferromagnetic yoke 20, the circumferential direction of the ferromagnetic yoke 20 constitutes a longer direction relative to the ferromagnetic yoke 20. When the pinning action is neglected, the plurality of magnetic domains are inevitably formed mainly lengthwise and eventually caused to assume a state of magnetization inclined toward one circumferential direction. That is, the situation in which the writing speed on one part and the writing speed on the other part vary in the binary writing or the magnitudes of electric current and electric voltage required on one part and those of electric current and electric voltage required on the other part vary may possibly ensue. According to the first embodiment, since the state X of magnetization of the ferromagnetic yoke 20 is forcibly fixed in the wiring direction, the state X of magnetization is constantly maintained neutrally. On the occasion of effecting the writing work, therefore, it is made possible in the writing of both "0" and "1" to homogenize the magnitudes of electric current and electric voltage and the speed of forming a magnetic field (i.e. the rate of rise/writing speed) in the combination reading-writing wire 5 without having to rely on the direction of the electric current in the combination reading-writing wire 5.

Further, according to the present magnetic memory 1, by forming the ferromagnetic yoke 20 and thereafter superposing the yoke-grade antiferromagnetic layer 26 thereon in the process of manufacture, it is made possible to form the yoke-grade antiferromagnetic layer 26 on the outer peripheral sides of the counterelement side yoke 20B and the lateral part yoke 20C and pinned down the ferromagnetic yoke 20 easily. Further, in the case of a complicated structure such that the combination reading-writing wire 5 is bent before and after the ferromagnetic yoke 20 as in the present magnetic memory, these wires are liable to produce a magnetic field constituting a noise. The ferromagnetic yoke 20 is vulnerable to such a varying noise magnetic field as this. By having the ferromagnetic yoke 20 fixed with the yoke-grade antiferromagnetic layer 26, however, it is made possible to abate the influence of the noise because the state X of magnetization thereof is biased in the neutral direction.

Figure 10:
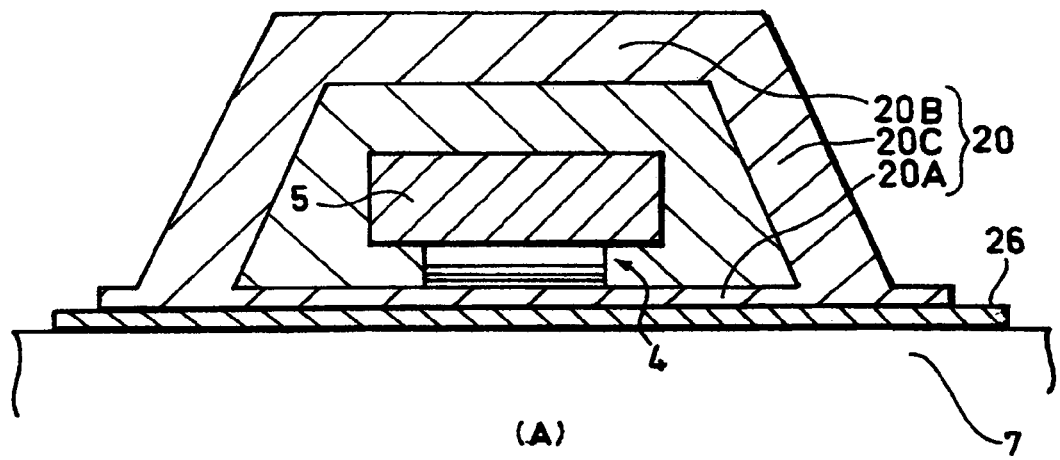
FIG. 10 is a cross section illustrating another typical structure in the magnetic layer.
Figure 10:
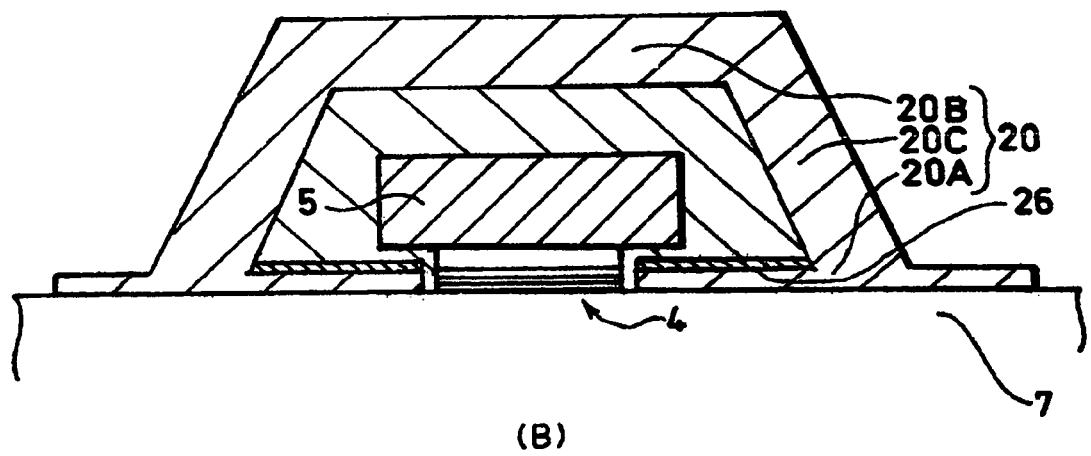

Incidentally, though the magnetic memory 1 has been described as effecting the abatement of the influence of noise by the addition of the yoke-grade antiferromagnetic layer 26 to the counterelement side yoke 20B and the lateral part yoke 20C, the abatement may be preferably accomplished by positively fixing the element side yoke 20A by preparatorily forming the yoke-grade antiferromagnetic layer 16 on the reading wire 7 and subsequently forming the element side yoke 20A thereon as illustrated in FIG. 10 (A), for example.

It is likewise preferable to divide the element side yoke 20A and interpose TMR elements 4 between the divided portions as illustrated in FIG. 10 (B). In this case, it is permissible to establish direct contact between the TMR element and the reading wire 7 while securing a gap between the divided surface of the element side yoke 20A and the end face of the TMR element 4. As a result, the magnetic field produced by the ferromagnetic yoke 20 can be applied to the end face of the TMR element 4 and the writing and reading responsivity can be enhanced. It is further permissible to have the yoke-grade antiferromagnetic layer 26 to the inner peripheral side (i.e. the combination reading-writing wire 5 side) of each of the element side yokes 20A, for example. Incidentally, the expression "division of the element side yoke" as used in this invention means the formed state of the ferromagnetic yoke 20 completed through the process of manufacture. It does not need to be restricted to the case of forming the element side yoke 20A continuously and subsequently subjecting it to a dividing work. It is permissible, for example, to form a pair of element side yokes 20A (capable of assuming a divided state) separately and interpose the TMR element therebetween.

Figure 11:
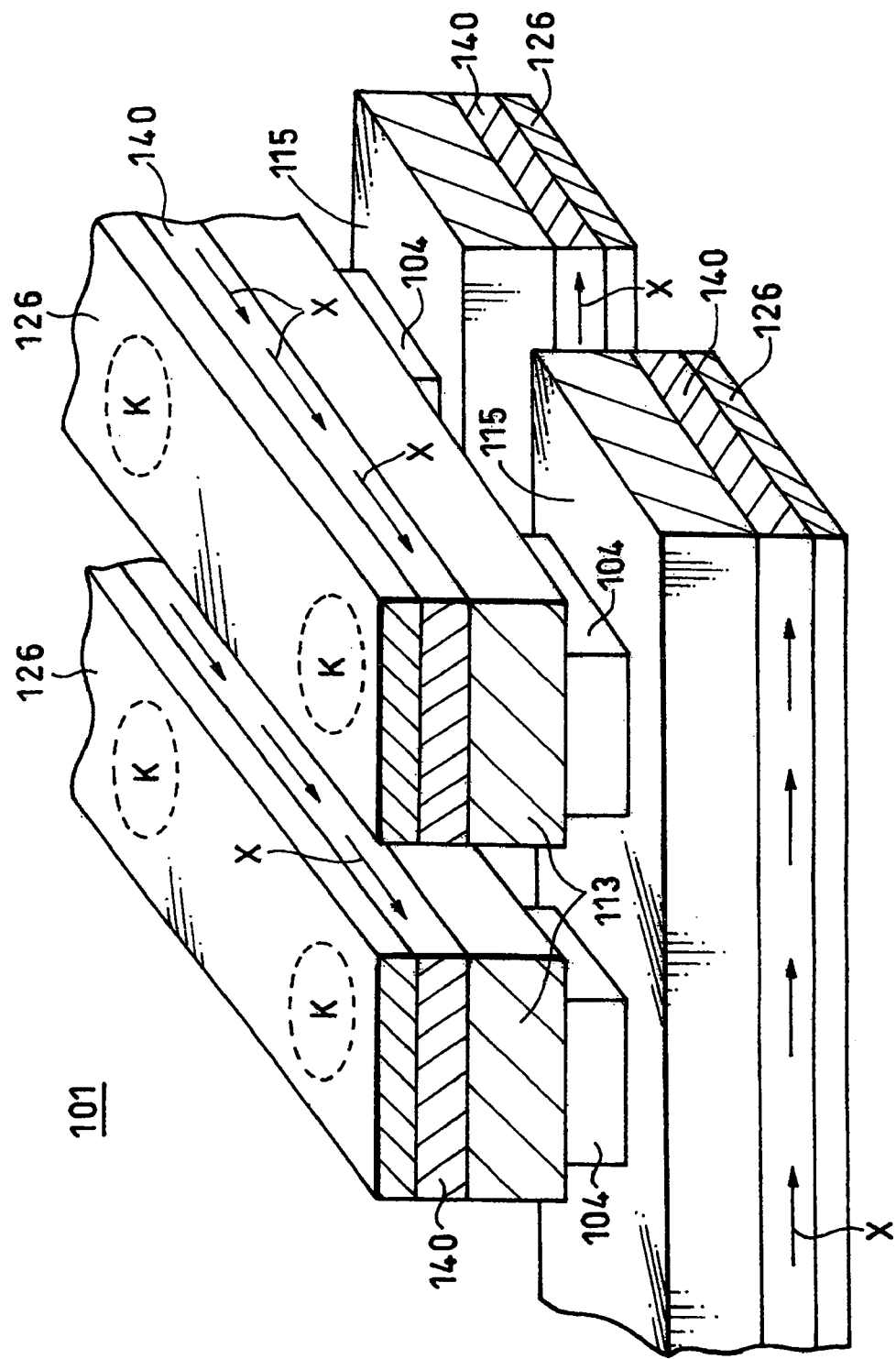
FIG. 11 is a perspective view illustrating the structure of a magnetic memory according to the second embodiment of this invention in an enlarged scale

A magnetic memory 101 according to the second embodiment of the invention will be explained below with reference to FIG. 11. This magnetic memory 101 is furnished with a plurality of bit lines 113, a plurality of word lines 115, and a plurality of TMR elements 104. The bit lines 113 are disposed mutually parallelly within a plane and the word lines 115 are likewise disposed mutually parallelly within a plane separated by a prescribed distance from the bit lines 113. Incidentally, since the directions of extension of the bit lines 113 and the word lines 115 are perpendicular to each other, these lines 113 and 115 form a space lattice in an overall view. The bit lines 113 and the word lines 115 are enabled by the electric current flowing therein to produce a writing magnetic field for the sake of the TMR elements 104.

The TMR elements 104 are adjacently disposed at the places (the so-called cross points K) where the bit lines 113 and the word lines 115 intersect each other. Specifically, they are disposed so as to be nipped between the bit lines 113 and the word lines 115. As a result, the one side surfaces of the TMR elements 104 collide against the bit lines 113 and the other side surfaces thereof collide against the word lines 115.

Incidentally, the fact that the TMR elements 104 are disposed at the cross points K which constitute the intersections of the space lattice as described above, in other words, means that the individual bit lines 113 or word lines 115 are disposed astride the plurality of TMR elements 104.

Further, all the bit lines 113 and word lines 115 are partly covered along the longer direction with wiring-grade ferromagnetic layers 140 and consequently made to form a so-called clad structure. The wiring-grade ferromagnetic layers 140 are so disposed as to cover directly the reverse side surfaces (counterelement side surfaces) of the TMR elements 104 in the bit lines 113 and the word lines 115 and these wiring-grade ferromagnetic layers 140 constitute a structure for repressing the leakage of magnetic fluxes produced from the individual wires 113 and 115. As a result, the magnetic fluxes which are generated from the bit lines 113 and the word lines 115 are concentrated on the TMR elements 104 existing on the side opposite the wiring-grade ferromagnetic layers 104.

Further, cladding-grade antiferromagnetic layers 126 are added to the outer side surfaces of the wiring-grade ferromagnetic layers 140 (the reverse side surfaces of the bit lines 113 and the word lines 115). By the exchange coupling on the composition planes with the cladding-grade antiferromagnetic layers 126, the directions of magnetization of the wiring-grade ferromagnetic layer 140 are stabilized. The direction of pinning the state X of magnetization of the wiring-grade ferromagnetic layer 140 with the cladding-grade antiferromagnetic layers 126 is so set as to coincide approximately with the direction of extension of the bit lines 113 or the word lines 115 which are covered with the wiring-grade ferromagnetic layers 140. As a result, the state of magnetization of the wiring-grade ferromagnetic layer 140 in the absence of the flow of electric current to the bit lines 113 and the word lines 115 comprises single magnetic domains and wiring directions.

The writing work performed in the present magnetic memory 101 comprises first selecting one line from the plurality of bit lines 113 based on a request address, selecting as well one line from the plurality of word lines 115 based on the same request address, then judging which of the binary information (0, 1) be used for writing, and passing an electric current in response to the binary information. Since the bit lines 113 and the word lines 115 produce magnetic fields in the circumferential directions as a result, the directions of the state X of magnetization of the individual wiring-grade ferromagnetic layers 140 are smoothly rotated in such a manner as to be guided by these magnetic fields till they coincide with the magnetic fields of the individual lines 113 and 115. By the interaction of the magnetic fields of the bit lines 113 and the word lines 115, the states of magnetization of the first magnetic layers (not shown) of the TMR elements 104 are set in prescribed directions to complete the writing work of the binary information.

Also in the present magnetic memory 101, similarly to the first embodiment, the states X of magnetization of the wiring-grade ferromagnetic layers 140 for preventing leakage of magnetic fluxes are fixed in the direction of extension of the wires for the sake of forming single magnetic domains. The states X of magnetization based on the induction of the magnetic fields produced from the bit lines 113 or the word lines 115 are smoothly changed and the writing noises are abated. Particularly, when the magnetizing properties of the wires 113 and 115 in the longer directions are deprived of uniformity by adopting the clad structure therefor where a plurality of cross points K exist throughout the longer direction of one of the word lines 113 or bit lines 115 as in the present second embodiment, the strength of magnetic field and the fluctuating property for the individual TMR elements 104 (cross points K) are inevitably varied and the timing control and the electric current/electric voltage control during the course of writing become complicated. In the present magnetic memory 101, however, since the magnetic properties of the individual lines 113 and 115 in the entire longer directions are homogenized with the cladding-grade antiferromagnetic layer 126 in spite of the clad structure formed for the individual wires 113 and 115, it is made possible to homogenize the states of magnetization during the course of writing for all the TMR elements 104 and increase writing speed.

Figure 12:
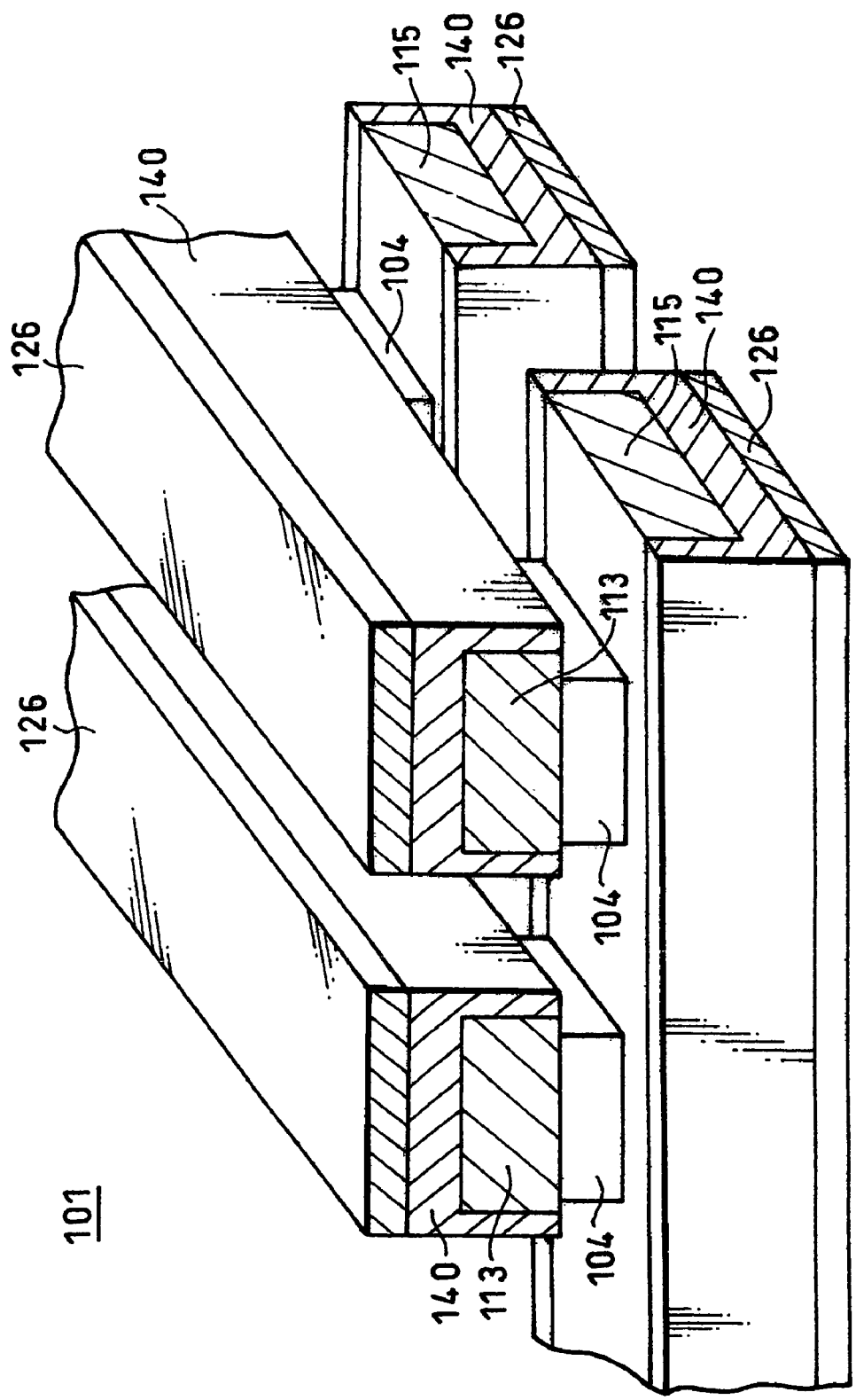
FIG. 12 is a perspective view illustrating another typical structure of the magnetic memory.
Figure 13:
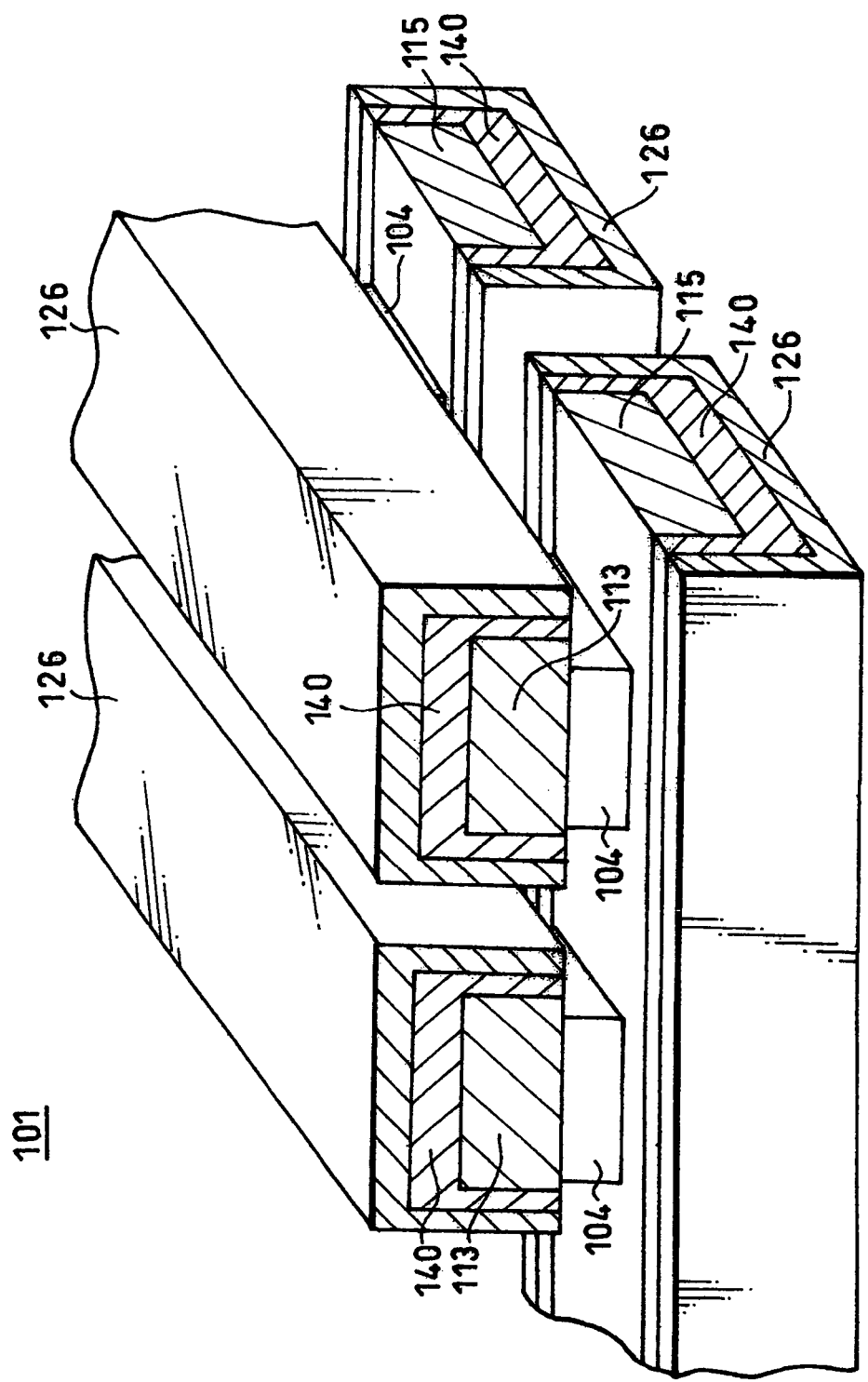
FIG. 13 is a perspective view illustrating another typical structure of the magnetic memory.

Incidentally, while the magnetic memory 101 of the present second embodiment has been described with reference to the case of covering only the counterelement surfaces of the bit lines 113 and the word lines 115, the present invention does not need to be restricted to this mode. Preferably, the wiring-grade ferromagnetic layers 140 are laid each in the shape of a cross section of three sides of a square in such a manner as to cover not only the counterelement surfaces of the wires 113 and 115 but also the opposite lateral surfaces of the individual wires 113 and 115 which continue into the counterelement surfaces as illustrated in FIG. 12, for example, with the result that the volume of leak of magnetic fluxes will be decreased more and the TMR elements will be provided more efficiently with a magnetic field. On this occasion, the cladding-grade anti ferromagnetic layers 126 may be added to only the outer counterelement surface sides in the wiring-grade ferromagnetic layers 140 or the cladding-grade antiferromagnetic layers 126 maybe added to the entire outer peripheral regions of the wiring-grade ferromagnetic layers 140 each of the shape of a cross section of three sides of a square in such a manner as to embrace the wires, the clads, and the antiferromagnetic layers collectively in the shape of a cylinder liner as illustrated in FIG. 13.

In the present magnetic memory 101, the cladding-grade antiferromagnetic layers 126 may be added to only either the bit lines 113 or the word lines 115. Preferably, the present magnetic memory 101 has the combination of various clads as illustrated in FIG. 11-FIG. 13. For example, the word lines 115 below the TMR elements may be added to the clads with the cladding-grade antiferromagnetic layers as illustrated in FIG. 11, and the bit lines 113 above the TMR elements may be added to the clads with the cladding-grade antiferromagnetic layers as illustrated in FIG. 12.

The present second embodiment has been described with reference to the case of having the bit lines 113 and the word lines 115 covered throughout the entire longer directions thereof. The present invention never the less does not need to be restricted to this mode. Optionally they may be covered partially in the longer directions thereof. From the viewpoint of exalting the intensity of a magnetic field to be formed for the TMR elements 104, for example, the individual wires 113 and 115 may have the regions thereof including at least the cross points K partially covered so as to assume a partially clad structure.

Figure 14:
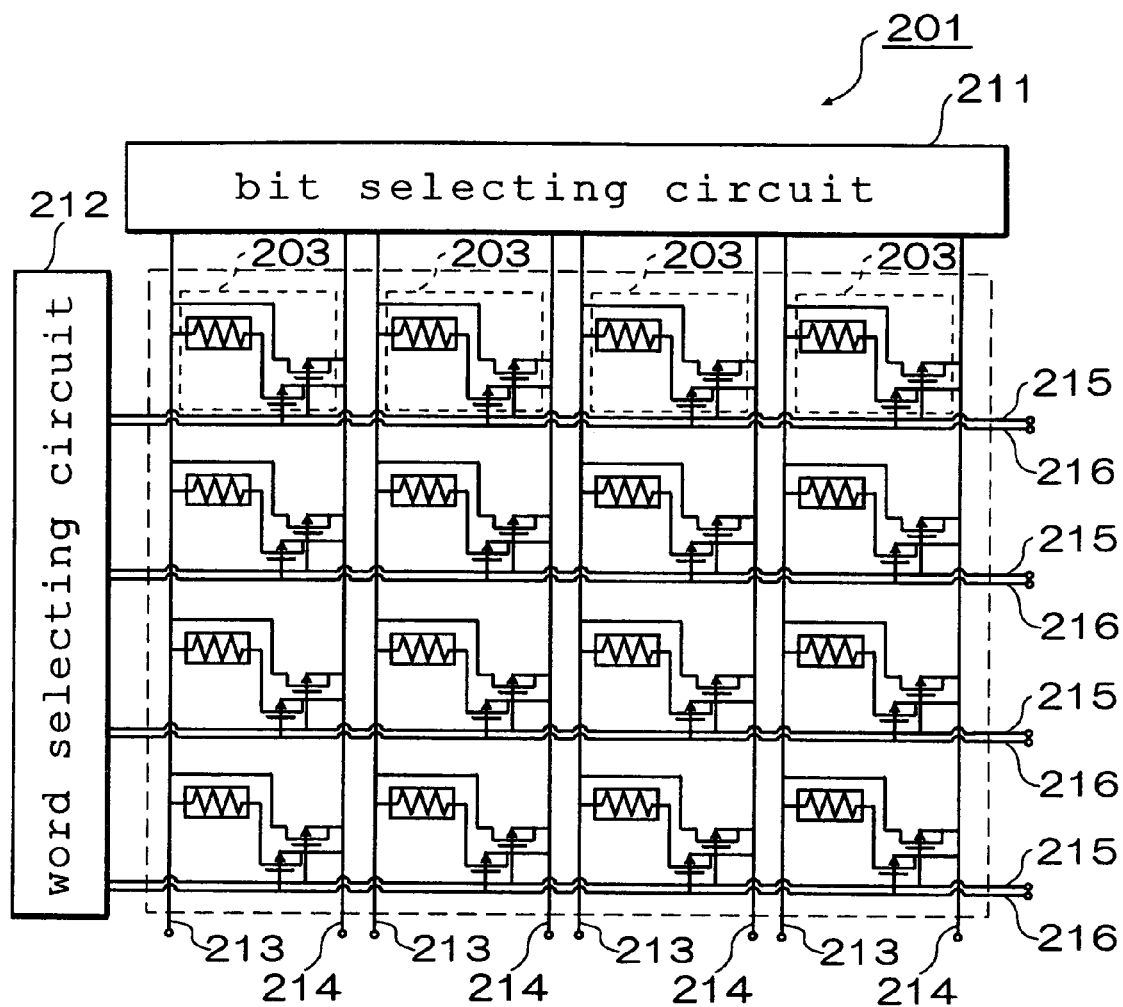
FIG. 14 is a conceptual view illustrating the whole structure of the magnetic memory according to the third embodiment of this invention.

In FIG. 14, a magnetic memory 201 constituting a third embodiment of the present invention is illustrated in its overall structure. Incidentally, the magnetic memory 201 will be described below as centered on the points in which it differs from the first embodiment. The parts and members thereof which are shared with the first embodiment will be omitted from the following description by resorting to coincidence in the two least significant digits of relevant reference numerals.

Figure 15:
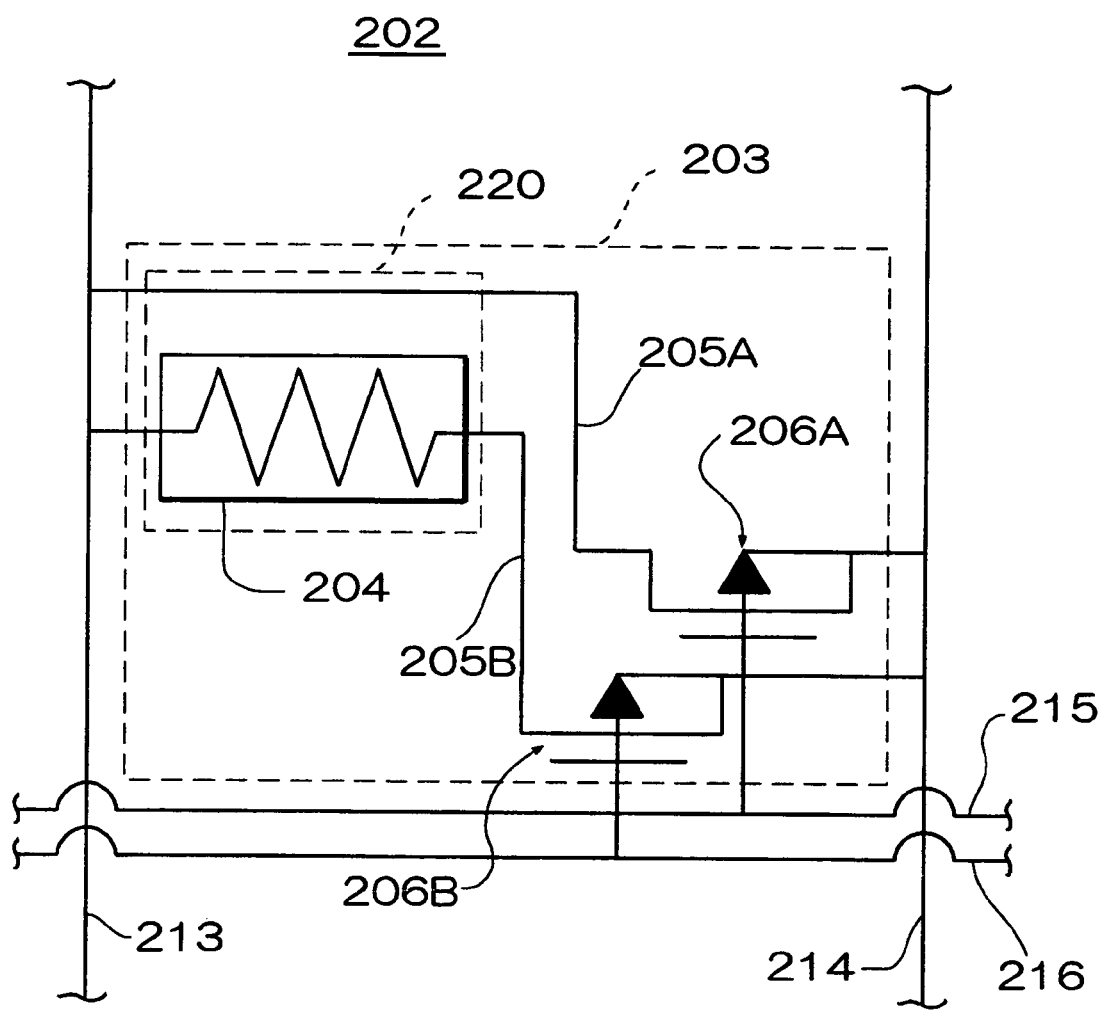
FIG. 15 is a conceptual diagram illustrating the memory cell of the magnetic memory in an enlarges scale.

An individual memory cell 203 of a memory part 202 in this magnetic memory 201 is furnished, as illustrated in an enlarged scale in FIG. 15, with a TMR element 204, a writing-grade wire 205A, a reading-grade wire 205B, a writing-grade transistor 206A, a reading-grade transistor 206B, etc. Unlike the first embodiment which utilizes combination reading-writing wires, the magnetic memory 201 of the third embodiment is adapted to abate such causes of noise as wraparound current by having the writing-grade wire 205A and the reading-grade wire 205B disposed separately from each other.

The opposite terminals of the writing-grade wire 205A are connected to two bit lines 213 and 214 and the writing-grade transistor 206 is interposed between these terminals. As a result, by applying an electric voltage between the bit lines 213 and 214 and turning the writing-grade transistor 206A on, it is made possible to supply the writing-grade wire 205A with an electric current and generate a magnetic field around the periphery of the adjacently disposed TMR element 204. Then, the opposite terminals of the reading-grade wire 205B are also connected to the two bit lines 213 and 214 and the reading-grade transistor 206 and the TMR element 204 are interposed between these terminals. As a result, by applying an electric voltage between the bit lines 213 and 214 and turning the reading-grade transistor 206B on, it is made possible to supply the reading-grade wire 205B with an electric current and detect a change in the magnitude of resistance of the TMR element. Incidentally, the writing-grade transistor 206A is connected to a word line 215 and the reading-grade transistor 206B is connected to a word line 216. By utilizing the electric voltage applied to the word lines 215 and 216, therefore, it is made possible to switch the states of continuity of the individual transistors 206A and 206B independently of each other. As a result, an electric current may be advanced as occasion demands from the bit lines 213 and 214 to the word line 215.

Figure 16:
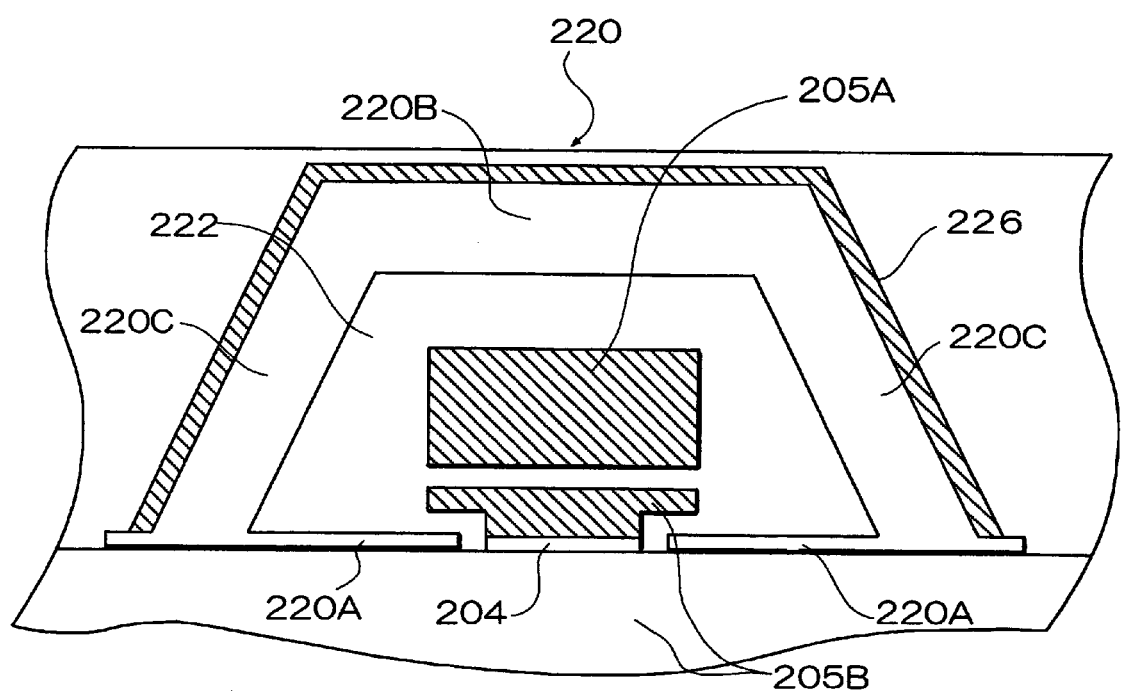
FIG. 16 is a cross section illustrating the inner structure of the memory cell in an enlarged scale.

In FIG. 16, a ferromagnetic yoke 220 is illustrated in an enlarged scale. This ferromagnetic yoke 220 is composed of an element side yoke 220A which is disposed adjacently to the TMR element 204 side in the writing-grade wire 205A, a counterelement side yoke 220B which is disposed adjacently to the side opposite the TMR element 204 in the writing-grade wire 205A, and a pair of lateral part yokes 220C and 220C which are disposed so as to connect the opposite terminals of the element side yoke 220A and the opposite terminals of the counterelement side yoke 220B substantially in a circumferential shape and pass the writing-grade wire 205A therethrough. Incidentally, in the gap which is formed in the element side yoke 220A, the TMR element 204 is disposed.

The TMR element 204 and the writing-grade wire 205A are set in a mutually insulated state by an insulator 222. Meanwhile, the upper end face and the lower end face of this TMR element 204 are connected to the reading-grade wire 205B. Incidentally, the reading-grade wire 205B is formed in a thin-film structure having such a downwardly convexed cross section in order that the writing-grade wire 205A and the TMR element 204 may approximate each other to the fullest possible extent.

Further, a yoke-grade antiferromagnetic layer 226 is formed on the outer peripheral sides of the counterelement side yoke 220B and the lateral part yokes 220C and 220C in the ferromagnetic yoke 220. As a result, the ferromagnetic yoke 220 has the direction of magnetization thereof stabilized by the exchange coupling on the bonded surface of this yoke-grade antiferromagnetic layer 226. The direction of fixing the state of magnetization in the ferromagnetic yoke 220 is so set as to coincide approximately with the direction of extension of the writing-grade wire 205A, namely the direction perpendicular to the induced magnetic field produced by the writing-grade wire 205A.

The magnetic memory 201 of the present third embodiment is capable of achieving the same effect as the first embodiment and is further capable of supplying exclusively the writing-grade wire 205A with an electric current during the course of writing operation because the writing-grade wire 205A and the reading-grade wire 205B are independent of each other. Meanwhile, it is capable of supplying exclusively the writing-grade wire 205A with an electric current during the course of writing operation. As a result, the actions of writing and reading can be further stabilized because the wraparound current can be avoided without resorting to a diode, for example.

Example

Figure 17:
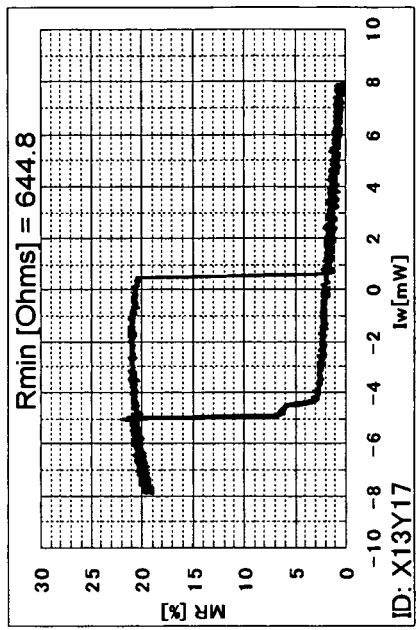
FIG. 17 is a graphic diagram illustrating the state of change of the MR ratio of the magnetic memory according to a working example.
Figure 17:
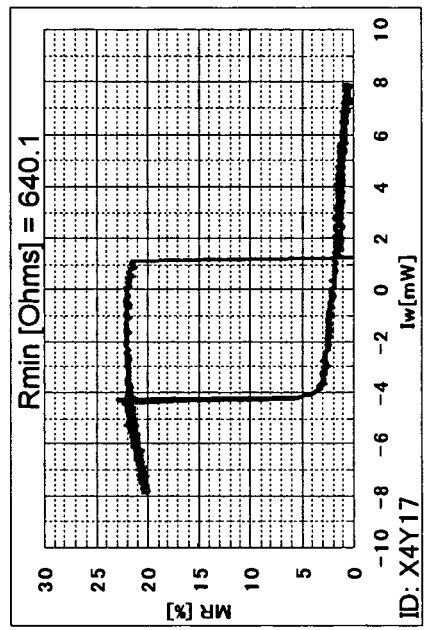
Figure 17:
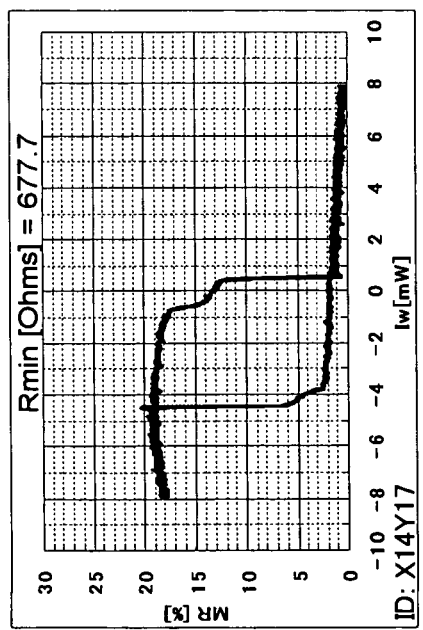
Figure 17:
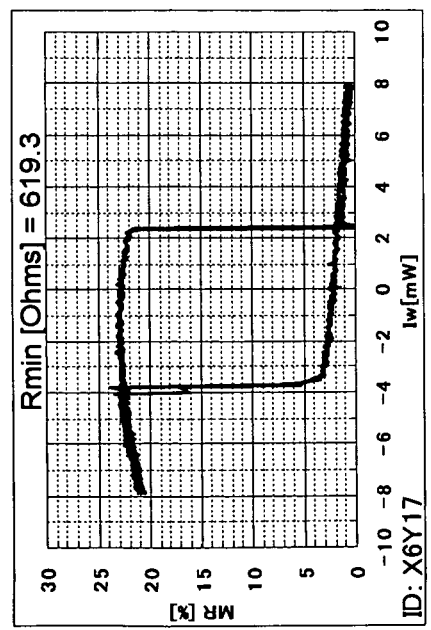

In a magnetic memory 201 of the third embodiment, four memory cells 203 (samples No. 1-4) were produced, a writing-grade wire 205A was supplied with an electric current, and a TMR element 204 was examined to determine the state of inversion consequently induced therein. Specifically, the size in the direction of length of the writing-grade wire 205A was set at 0.2 μm and the size in the direction of width thereof at 0.5 μm, the width of the writing-grade wire 205A at 0.5 μm, the size in the direction of length of the writing-grade wire 205A in the ferromagnetic yoke 220 at 0.2 μm, the wall thickness of the element side yoke 220A at 20 nm, and the wall thickness of the counterelement side yoke 220B at 50 nm. The state of inversion of the magnetic field of the TMR element 204 was determined by measuring the state of fluctuation of the MR ratio (%) of the TMR element 204. Incidentally, the MR ratio refers to the ratio expressed by the formula, {R (a . . . b)–R (a=b)}/R (a=b), wherein R (a=b) denotes the magnitude of resistance of the TMR element 204 where the direction of magnetization of the first magnetic layer coincides with the direction of magnetization of the second magnetic layer in the TMR element 204 and R (a . . . b) denotes the magnitude of resistance of the TMR element 204 where the direction of magnetization of the first magnetic layer is opposite to the direction of magnetization of the second magnetic layer. The results are shown in FIG. 17.

It is clear from the diagrams that stable hysteresis curves of very small noise were described even when the direction of flow of electric current to the writing-grade wire 205A was repeatedly inversed. Since the shapes of hysteresis curves approximated a point symmetry, it is clear that the states of magnetization of the ferromagnetic yoke 220 were in good balance. This inference may be logically explained by supposing that the magnetic fields of the ferromagnetic yoke 220 were converted into single magnetic domains in a neutral state by the yoke-grade antiferromagnetic layer 226. As a result, even when the plurality of memory cells 203 were disposed in an arrayed pattern, the speed of writing was homogenized among all the memory cells 203.

Comparative Example

Figure 18:
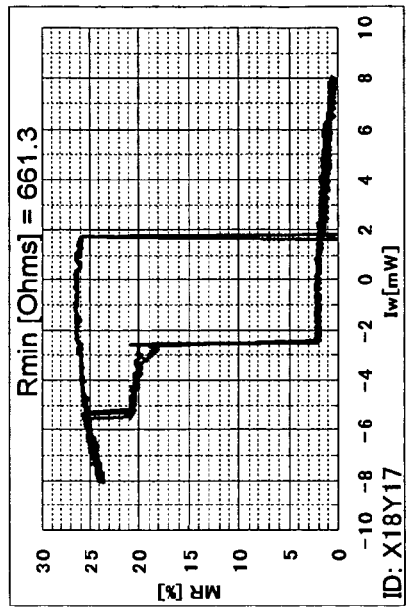
FIG. 18 is a graphic diagram illustrating the state of change of the MR ratio of the magnetic memory according to a comparative example.
Figure 18:
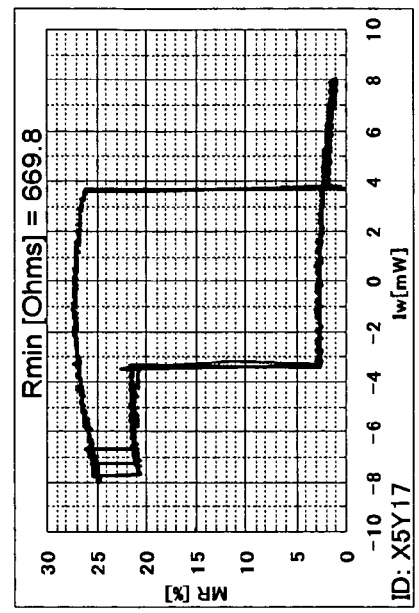
Figure 18:
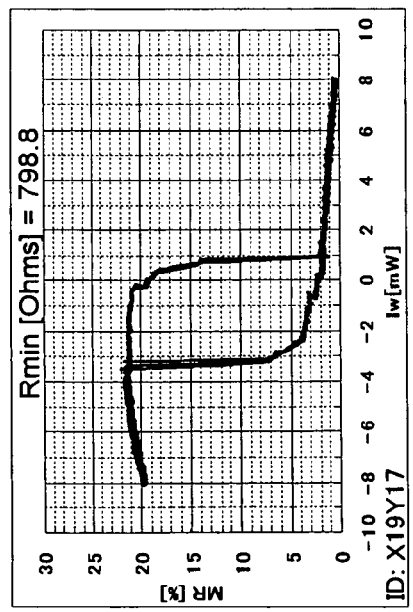
Figure 18:
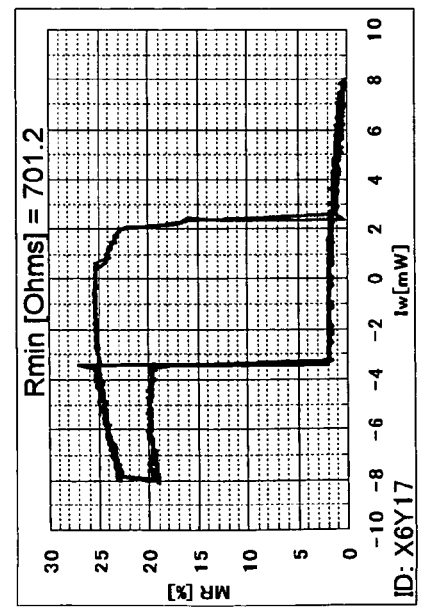
Figure 19:
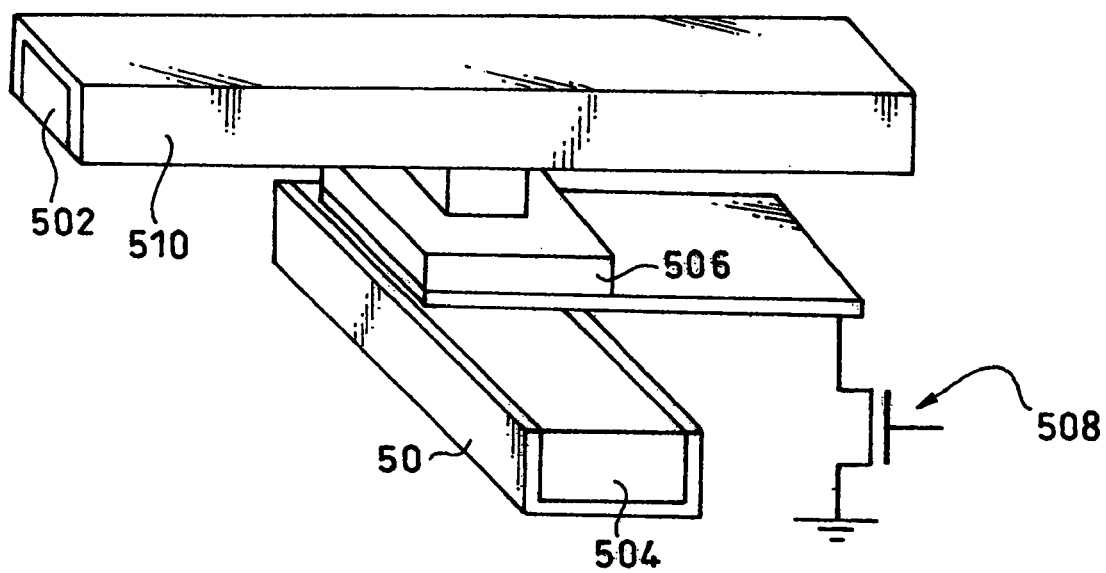
FIG. 19 is a perspective view illustrating another typical structure of the conventional magnetic memory.

For the purpose of clarifying the effect of the yoke-grade antiferromagnetic layer 226, four memory cells (samples No. 5-8) dimensionally equaling those of the magnetic memory 201 produced in the working example and excluding the yoke-grade antiferromagnetic layer 226 were produced, a writing-grade wire 205A was supplied with an electric current, and a TMR element were examined to determine the extent of inversion induced consequently therein, i.e. the MR ratio. The results are shown in FIG. 18.

It is clear from the diagrams that large noises were generated partially when the direction of electric current supplied to the writing-grade wire 205A was inversed repeatedly. This means that the states of magnetization of the ferromagnetic yoke 220 were unstable. Further, the overall shapes of hysteresis curves lacked symmetry, a fact clearly indicating that the writing in one direction and the writing in the other direction in the TMR element 204 widely differed in response property. This inference may be logically explained by supposing that the plurality of magnetic domains were inevitably formed main in the directions of length and the states of magnetization were biased in one circumferential direction because the ferromagnetic yokes 220 were not fixed.

Incidentally, the magnetic memory contemplated by this invention does not need to be limited to any of the embodiments cited above but allows a varying modification. While the embodiment cited above used a TMR element as a magneto-resistivity effect element, a GMR element utilizing giant magneto-resistivity effect (GMR) may be used instead, for example. The term "GMR effect" means a phenomenon that the magnitude of resistance of a ferromagnetic layer in the direction perpendicular to the direction of lamination is varied by the angle formed by the directions of magnetization of two ferromagnetic layers including a nonmagnetic layer. That is, in the GMR element, the magnitude of resistance of the ferromagnetic layer is minimized when the directions of magnetization of the two ferromagnetic layers are parallel to each other and maximized when the directions of magnetization of the two ferromagnetic layers are not parallel to each other. Incidentally, the TMR element and the GMR element are each known in two types, i.e. a para-spin bulb type which effects writing/reading by making use of the difference of coercive force between the two ferromagnetic layers and a spin bulb type which fixes the direction of magnetization of one of the ferromagnetic layers by exchange coupling with the antiferromagnetic layer. Then, the reading of data in the GMR element is effected by detecting the magnitude of resistance of the ferromagnetic layer in the direction perpendicular to the direction of lamination. The writing of data in the GMR element is effected by inverting the direction of magnetization of one of the ferromagnetic layers by the magnetic field produced by the writing electric current.

In the first or third embodiment cited above, the transistor (combination reading-writing transistor) was used as a switching means for controlling the writing electric current and the reading electric current. As the switching means, a varying means which is endowed with the function of putting on/off continuity of electric current maybe adopted as occasion demands.

Further, the present embodiment has been described with reference to the case of resorting to the addition of an antiferromagnetic layer to a ferromagnetic body as means for fixing the state of magnetization of the ferromagnetic body which covers wires. The present invention does not need to be limited to this mode. The pinning effect, for example, may be achieved by providing an additional magnetic layer for the ferromagnetic body serving to cover wires through the medium of a nonmagnetic metal layer and consequently enabling the magnetic layer to form an antiferromagnetic coupling with the ferromagnetic body.

The magnetic memory contemplated by this invention does not need to be limited to the mode of embodiment cited above and is naturally allowed to incorporate a varying modification without departing from the spirit of the invention.

This invention can be extensively utilized in such a field as recording and retaining various information by means of the magneto-resistivity effect element.

The entire disclosure of Japanese Patent Application No. 2005-217141 filed on Jul. 27, 2005 and Japanese Patent Application No. 2006-73982 filed on Mar. 17,2006 including specification, claims, drawings, and summary are incorporated herein by reference in its entirety.

What is claimed is:

1. A magnetic memory, comprising:
a wire for producing a writing field,
a magneto-resistivity effect element disposed on said wire,
a ferromagnetic yoke disposed on four sides of said wire as to at least partially cover said wire in a longitudinal direction of said wire with said magneto-resistivity effect element, and
an antiferromagnetic layer added to said ferromagnetic yoke and adapted to establish substantial coincidence between the pinning direction of the state of magnetization of said ferromagnetic yoke and the direction of extension of said wire, and wherein said ferromagnetic yoke is composed of an element side yoke disposed on a side of said magneto-resistivity effect element across a gap from said wire, a counter-element side yoke disposed on the side opposite said magneto-resistivity effect element on said wire across a gap from said wire, and a pair of lateral part yokes looping said ferromagnetic yoke by connecting opposite terminals of said element side yoke and opposite terminals of said counter-element side yoke and disposed across a gap from said wire, said gap is occupied by an insulator, said wire and said ferromagnetic yoke are set in a mutually insulated state by said insulator, and said wire is passed toward inner peripheral sides of said pair of lateral part yokes and said antiferromagnetic layer is added to at least part of inner peripheral sides of said element side yoke of said ferromagnetic yoke.

2. A magnetic memory according to claim 1, wherein said lateral part yokes of said ferromagnetic yoke are disconnected from each other by dividing said element side yokes in circumferential direction thereof and said magneto-resistivity effect element is disposed so as to occur in divided regions of said element side yokes.

3. A magnetic memory according to claim 1, wherein said wire is bent in a region exterior to the ferromagnetic yoke.

* * * * *